US 6,706,336 B2

(12) United States Patent
Kondo et al.

(10) Patent No.: US 6,706,336 B2
(45) Date of Patent: Mar. 16, 2004

(54) SILICON-BASED FILM, FORMATION METHOD THEREFOR AND PHOTOVOLTAIC ELEMENT

(75) Inventors: Takaharu Kondo, Kyoto (JP); Masafumi Sano, Kyoto (JP); Koichi Matsuda, Kyoto (JP); Makoto Higashikawa, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 23 days.

(21) Appl. No.: 10/055,974

(22) Filed: Jan. 28, 2002

(65) Prior Publication Data
US 2002/0166581 A1 Nov. 14, 2002

(30) Foreign Application Priority Data

Feb. 2, 2001 (JP) ........................................ 2001-027553
Mar. 22, 2001 (JP) ........................................ 2001-082822

(51) Int. Cl.[7] .......................... C23C 16/24; C23C 16/44
(52) U.S. Cl. ...................... 427/588; 427/585; 427/74; 427/578; 438/680; 136/261
(58) Field of Search ................ 427/585, 588, 427/74, 578; 438/680; 136/261

(56) References Cited

U.S. PATENT DOCUMENTS 5,387,542 A    2/1995  Yamamoto et al. .......... 438/487
5,589,233 A  * 12/1996  Law et al. .................... 427/579
6,403,501 B1 *  6/2002  Hander et al. ............... 438/783

FOREIGN PATENT DOCUMENTS

| JP | 5-12850 | 8/1983 |
| JP | 4-35021 A | * 2/1992 |
| JP | 4-329627 | 11/1992 |
| JP | 5-136062 | 6/1993 |
| JP | 2001-127068 | * 5/2001 |

OTHER PUBLICATIONS

Fujimoto et al, "Development of Thin Film Silicon Solar Cells Using PCVD Process," IEEE, (1993), pp. 83–87.*

* cited by examiner

Primary Examiner—Alan Diamond
(74) Attorney, Agent, or Firm—Fitzpatrick, Cella, Harper & Scinto

(57) ABSTRACT

A silicon-based film of excellent photoelectric characteristics can be obtained by introducing a source gas containing silicon halide and hydrogen into the interior of a vacuum vessel, at least a part of the interior being covered with a silicon-containing solid, generating plasma in the space of the interior of the vacuum vessel, and forming a silicon-based film on a substrate provided in the interior of the vacuum vessel.

20 Claims, 12 Drawing Sheets

FUSION/SOLIDIFICATION

MELTING/REDEPOSITION

SILICON-BASED FILM, FORMATION METHOD THEREFOR AND PHOTOVOLTAIC ELEMENT

BACKGROUND OF THE INVENTION

1. Field of the Invention

The present invention relates to a silicon-based film, a forming method therefor, and a photovoltaic element.

2. Related Background Art

As a method of forming a thin silicon film showing crystalline properties, there has been employed a liquid-phase growing method such as casting method, but such method required high-temperature treatment and shows difficulty in achieving mass producibility and cost reduction.

As a method of forming a thin silicon film showing crystalline properties that is other than the casting method, Japanese Patent Application Laid-Open No. 5-136062 discloses a method of applying a hydrogen plasma processing after formation of amorphous silicon and repeating such formation and processing to obtain a polycrystalline silicon film.

In a photovoltaic element employing a thin silicon film showing crystalline properties, it is generally known that the mobility of carriers is hindered for example by the influence of dangling bonds of silicon at the crystal boundary, strain generated in the vicinity of the crystal boundary, imperfection in the crystal itself etc., thereby adversely influencing the photoelectric characteristics of the photovoltaic element.

In order to alleviate the above-mentioned influences, it is considered effective to improve the crystallinity and crystalline properties, and to increase the crystalline grain size thereby reducing the density of the crystal boundaries. For achieving the above, there has been tried to reduce the film forming rate or to execute film formation by repeating formation of a silicon film and annealing the film in a hydrogen atmosphere, but such processes have been a factor of extending the film forming time thereby raising the cost.

SUMMARY OF THE INVENTION

In consideration of the foregoing, an object of the present invention is to provide a method for forming a silicon-based thin film, which makes it possible to form a silicon thin film of excellent photoelectric characteristics with a film forming rate of an industrially practical level, thereby overcoming the above-described problems; and a photovoltaic element of excellent characteristics, adhesion and environment resistance employing thus formed silicon-based thin film.

According to the present invention, there is provided a method of forming a silicon-based film by plasma CVD, which comprises:

introducing a source gas containing silicon halide and hydrogen into the interior of a vacuum vessel, at least a part of the interior being covered with a silicon-containing solid; and generating plasma in the space of the interior of the vacuum vessel, and forming a silicon-based film on a substrate provided in the interior of the vacuum vessel.

According to the present invention, there is also provided a silicon-based film formed by the aforementioned forming method.

According to the present invention, there is also provided a photovoltaic element comprising semiconductor layers constituting at least a set of pin junction on a substrate, wherein: at least an i-type semiconductor layer is a silicon-based film formed by the aforementioned forming method.

The silicon-containing solid is a coating film formed in a region surrounding the plasma generating space in the vacuum vessel, and preferably has a resistivity higher than that of the vacuum vessel.

The coating film is preferably formed by a method which comprises:

introducing gases containing a silicon-containing gas into the interior of the vacuum vessel prior to the introduction of the source gas;

generating plasma in the space in the vacuum vessel; and forming a coating film by plasma CVD.

The silicon-based film preferably contains microcrystals of a crystal grain size having Scherrer radius of 10 nm or more.

The film forming rate of the silicon-based thin film after formation of a coating film having a resistivity higher than that of the vacuum vessel is preferably three or more times the film forming rate of the silicon-based thin film without formation of such coating film of higher resistivity.

The film forming rate of the silicon-based thin film after formation of a coating film having a resistivity higher than that of the vacuum vessel is preferably 1.0 nm/sec or higher.

The coating film preferably has a resistivity higher than that of the silicon-based film.

The coating film having a resistivity higher than that of the silicon-based film is preferably composed of silicon.

The gases containing the silicon-containing gas as a main component are preferably free from silicon halide gas.

The silicon halide preferably contains at least one kind of fluorine atom and chlorine atom.

The Raman scattering intensity resulting from the crystalline component of the silicon-based film is preferably three or more times the Raman scattering intensity resulting from the amorphous component.

In the X-ray or electron beam diffraction of the silicon-based film, the proportion of the diffraction intensity of (220) is preferably 50% or more of the total diffraction intensity.

The internal pressure of the vacuum vessel at the formation of the silicon-based film is preferably 50 mTorr (6.7 Pa) or higher.

Also in consideration of the above-mentioned problems, another object of the present invention is to provide a method of forming a silicon thin film showing excellent photoelectric characteristics and excellent uniformity even in a large area with a film forming rate of industrially practical level, and a photovoltaic element employing the silicon-based film formed by such method.

In the present invention, the aforementioned silicon-containing solid is preferably a member having at least a surface composed of silicon.

The above-mentioned member is preferably at least one selected from a plate-shaped silicon, a silicon grain, and a solid having a silicon film coating at least a part of the surface thereof.

The aforementioned substrate is preferably in a positional relationship opposed to a high frequency introducing portion provided in the vacuum vessel.

The aforementioned member is preferably placed on the aforementioned high frequency introducing portion.

The aforementioned silicon halide preferably contains at least one kind of a fluorine atom and a chlorine atom.

The aforementioned silicon-based film preferably includes microcrystals of a crystal grain size having a Scherrer radius of 20 nm or more.

The Raman scattering intensity resulting from the crystalline component of the silicon-based film is preferably three or more times the Raman scattering intensity resulting from the amorphous component.

In the X-ray or electron beam diffraction of the silicon-based film, the proportion of the diffraction intensity of (220) is preferably 70% or more of the total diffraction intensity.

The aforementioned silicon-containing solid is preferably a member having at least a surface composed of silicon.

DETAILED DESCRIPTION OF THE PREFERRED EMBODIMENTS

First Embodiment

Figure 1:
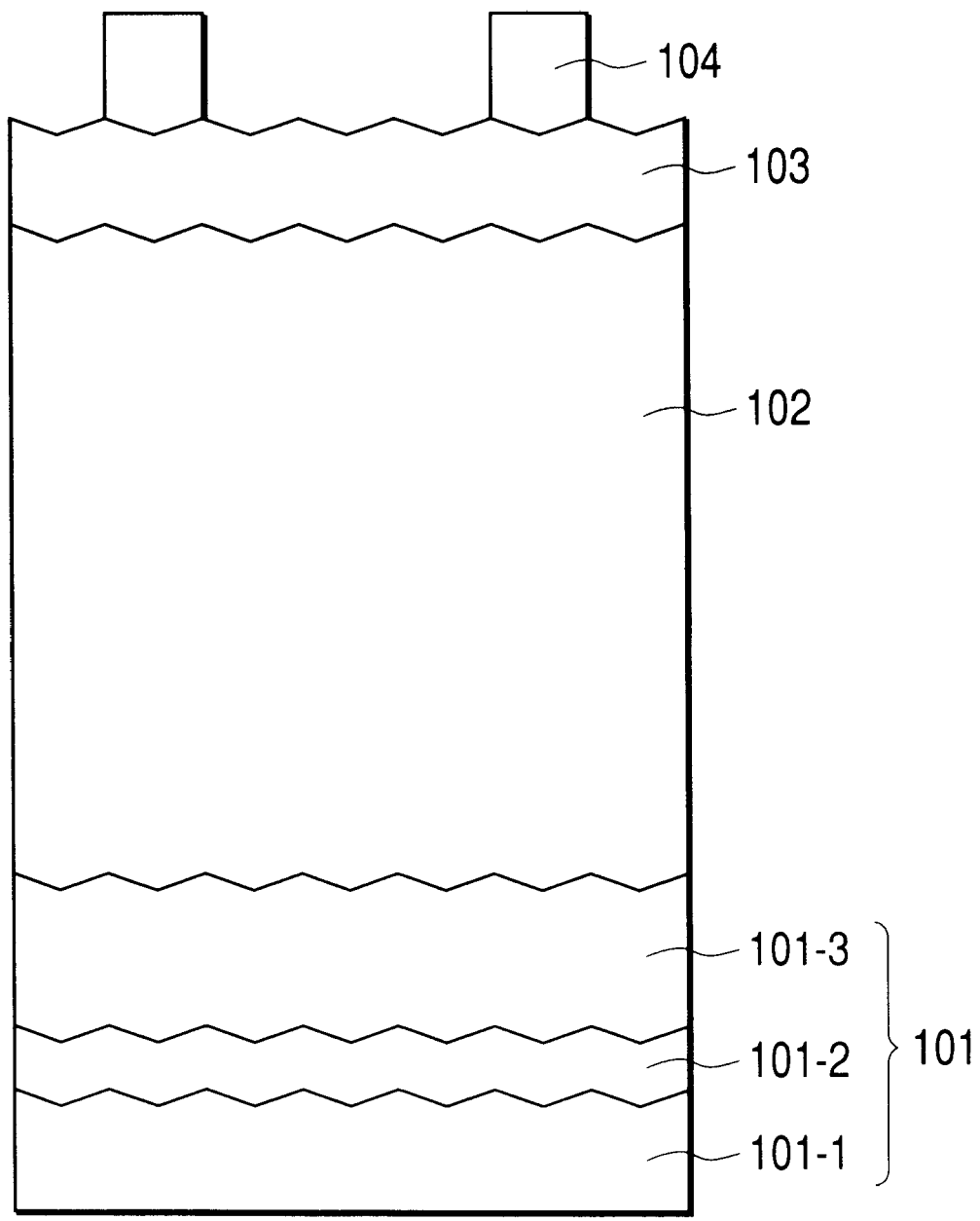
FIG. 1 is a schematic cross-sectional view of a photovoltaic element of the present invention.

As a result of intensive investigation for resolving the aforementioned problems, the present inventors have found that it is possible to form a silicon-based thin film showing excellent crystallinity and crystalline properties and satisfactory adhesion to the underlying layer at a high speed by:

introducing a source gas containing silicon halide and hydrogen into the interior of a vacuum vessel, at least a part of the interior being covered with a silicon-containing solid; and generating plasma in the space of the interior the vacuum vessel; and forming a silicon-based film on a substrate provided in the interior of the vacuum vessel;

wherein preferably the silicon-containing solid is a coating film formed in a region surrounding the plasma generating space in the vacuum vessel, and preferably has a resistivity higher than that of the vacuum vessel;

wherein more preferably the coating film is formed by a method which comprises:

introducing gases containing a silicon-containing gas as a main component into the interior of the vacuum vessel prior to the introduction of the source gas;

generating plasma in the space of the interior of the vacuum vessel; and forming a coating film by plasma CVD; and wherein more preferably the silicon-based film contains microcrystals of a crystal grain size having Scherrer radius of 10 nm or more.

The present inventors also have found that it is possible to form a photovoltaic element having good photoelectric conversion efficiency and excellent adhesion and environmental resistance properties with a low cost by employing the aforementioned silicon-based thin film in at least a part of at least an i-type semiconductor layer in a photovoltaic element containing semiconductor layers consisting of at least a set of pin junction on a substrate.

The above-described configuration provides the following effects.

The method of forming a silicon-based thin film containing crystalline phase by plasma CVD utilizing high frequency has a shorter process time and is capable of reducing the process temperature in comparison with the solid phase reaction, thereby being advantageous for cost reduction. Such effect is most evidently exhibited particularly by applying this method to an i-type semiconductor layer of a large film thickness in a photovoltaic element including a pin junction. More specifically, there is particularly preferable a method of forming a film by CVD utilizing high frequency of 10 MHz to 10 GHz.

In a photovoltaic element including a pin junction, the use of an i-type semiconductor layer containing crystalline phase as the i-type semiconductor layer substantially functioning as the light absorbing layer provides an advantage of suppressing the photodeteriorating phenomenon caused by Staebler-Wronski effect encountered in case of using an amorphous material.

On the other hand, the use of the silicon-based thin film containing crystalline phase as the i-type semiconductor layer is known to deteriorate the performance because the crystal boundaries affect both the majority carriers and the minority carriers. In order to suppress the influence of the crystal boundaries, an increase in the crystal grain size for reducing the density of the crystal boundaries is considered as one of the effective means. It is particularly preferred that the crystal grain size is large in the moving direction of the carriers and that the Scherrer radius is 10 nm or larger when the moving direction of the carriers is defined as a normal plane. The Scherrer radius indicates the crystal size in a direction perpendicular to an arbitrary lattice plane, defined by:

$$D = 0.9 \times \lambda / (\beta \times \cos\theta)$$

wherein $\lambda$ is the wavelength (nm) of X-ray, $\beta$ is the width (rad) of diffraction line and $\theta$ is the diffraction angle (°).

One of the factors increasing the crystal grain size is an increase in the orientatability of the crystal. Film deposition proceeding with random crystal orientation results in mutual collision of the crystal grains in the course of growth thereof, thereby resulting in relatively smaller crystal grains, but an oriented growth in a specified direction is considered to suppress the random mutual collision of the crystal grains thereby increasing the crystal grain size. Also in crystalline silicon having diamond structure, it is considered possible to form a silicon-based thin film of satisfactory adhesion and environmental resistance by adopting a (220) plane as the growth plane, since such (220) plane has the highest atomic density and since three bonds among four bonds of the silicon atom in the outermost growth plane link with other silicon atoms by covalent bonds. According to the ASTM card, in non-oriented crystalline silicon, the proportion of the diffraction intensity of the (220) plane to the total sum of the diffraction intensities of 11 reflections from the low angle side is about 23%, so that any structure having a proportion of the (220) plane exceeding 23% in the diffraction intensity is oriented in the direction of this plane.

In the high frequency plasma CVD employing a source gas containing silicon halide and hydrogen, various active species are generated in the plasma. The active species in the plasma include atoms, radicals, ions and molecules such as $SiX_nH_m$ ($0 \leq n$, $m \leq 4$), HX, X, H, etc. wherein X represents halogen atom. This system includes active species contributing to etching in addition to those contributing to the deposition of the silicon-based thin film, so that the film deposition proceeds with etching of Si—Si bond having a relatively low bonding strength at the film surface, whereby formation of a silicon-based thin film showing high crystallinity and a low proportion of amorphous regions is rendered possible.

Also, since the (220) plane grows with a high bonding strength as explained in the foregoing, it is considered possible, by executing the etching in effective manner, to form a crystalline phase in which the (220) plane selectively constitutes the growing plane. Also since the etching generates radicals by cleavage of chemical bonds to accelerate the structural relaxation, it is considered possible to form a silicon-based thin film of good quality at a lower process temperature, thereby facilitating the cost reduction.

As a result of intensive investigation in view of the suppression of photodeterioration phenomenon resulting from Staebler-Wronski effect and the reduction in the density of the crystal boundaries, the present inventors have found that the Raman scattering intensity resulting from the crystalline component (typically around 520 cm$^{-1}$) is preferably three or more times the Raman scattering intensity resulting from the amorphous phase (typically around 480 cm$^{-1}$) and that the above-mentioned effect is advantageously more enhanced in a structure in which the proportion of the (220) plane in the diffraction intensity is 50% or more of the total diffraction intensities.

The high frequency plasma CVD employing the source gas containing silicon halide and hydrogen involves mutually contradicting reactions of deposition and etching as explained in the foregoing, so that the control of plasma process is an important technical issue in order to achieve high-speed film formation. The addition of hydrogen to silicon halide is considered to form active species of halogenated silane involving hydrogen such as $SiX_2H$, $SiXH_2$, etc., but, in order to form such active species, it is considered to require an active reaction process between $SiX_4$ and hydrogen radical. Also hydrogen radical is considered to accelerate cleavage of excessive X atoms in the deposition film and to diffuse in the vicinity of the growing plane, thereby accelerating the structural relaxation and increasing the crystalline properties. Therefore, in order to realize a crystalline phase of high quality in the high-speed deposition, it is considered important that hydrogen radicals are present in a large amount in the vicinity of the substrate.

The vacuum vessel for film formation is generally composed of a metal such as stainless steel, used in a grounded state. In case plasma is generated in the high frequency CVD employing the source gas containing silicon halide and hydrogen after the formation of a coating film of a resistivity higher than that of the vacuum vessel in a region surrounding the plasma generating space of the vacuum vessel, the ratio of electron deposition becomes relatively higher because the plasma surrounding region is of a high resistance, in comparison with a case of high frequency plasma CVD employing the source gas containing silicon halide and hydrogen, in which plasma is generated in a state where the plasma is surrounded by a metal material of low resistance, thereby presumably forming a sheath of a relatively larger electric field in the vicinity of the vacuum vessel. In the latter case, because of the formation of a plasma potential involving the aforementioned sheath, the density of cations such as hydrogen ions increases in the vicinity of the vacuum vessel and the kinetic energy thereof increases in the sheath region, so that the mutual reaction of the active species becomes more active in the vicinity of the vacuum vessel, thereby increasing the relative density of the hydrogen radicals in the vicinity of the vacuum vessel. For increasing the amount of hydrogen radicals in the interior of the vacuum vessel, there can be conceived a method of increasing the amount of hydrogen in the source gas, but the method of plasma generation by the high frequency plasma CVD employing a source gas containing silicon halide and hydrogen after the formation of a coating film having a resistivity higher than that of the vacuum vessel can increase the density of hydrogen plasma only in the vicinity of the sheath region, thereby obtaining an effect far superior to that obtained in the method of increasing the amount of hydrogen in the source gas.

By introducing the aforementioned substrate into the atmosphere having plasma distribution of such a high hydrogen radical density, particularly in case the introduction position of a substrate is in the vicinity of the internal wall of the vacuum vessel, it is considered possible to form a silicon-based thin film of crystalline phase of high quality by high-speed deposition. Particularly conspicuous is the effect of increasing the deposition rate, and, in a state where a metal material surrounds the plasma forming space, even under a film forming condition where the silicon-based thin film is not deposited because of the plasma state in which the etching reaction prevails rather than the depositing reaction, or under a film forming condition with a very low deposition rate, it may be rendered possible to form the silicon-based thin film with a sufficient deposition rate (1.0 nm/sec or more) by generating plasma after formation of a coating film having a resistivity higher than that of the vacuum vessel. Consequently this makes it possible to form a silicon-based thin film that cannot be realized under a condition where a metal material surround the plasma generating space.

In consideration of the influence of degassing from the aforementioned coating film in the formation of the silicon-based thin film, such coating film is preferably composed of silicon which is the same component as of the deposited film. The coating film can be formed by the high frequency plasma CVD similarly as in the formation of the silicon-based thin film. The coating film formation is preferably executed under a condition of a large depositing effect by using a coating-film-forming gas containing a silicon-containing gas such as $SiH_4$, $Si_2H_6$ or $SiF_4$ as a main component. The silicon-containing gas may be added with a diluting gas such as $H_2$ or He. The coating-film-forming gas is preferably free from silicon halide gas because the coating film can be formed at a high speed.

In order to enhance the effect of increasing the hydrogen plasma density in the vicinity of the substrate, the coating film preferably has a resistivity higher than that of the vacuum vessel and at the same time a resistivity higher than that of the silicon-based thin film. In order to achieve a resistivity of the coating film higher than that of the silicon-based thin film, there can be preferably employed a method of forming the coating film in amorphous phase, a method of forming the coating film by a mixture of crystalline phase and amorphous phase, a method of forming the coating film in crystalline phase of a crystallinity lower than that of the silicon-based thin film, or a method of adding a small amount of oxygen to the coating-film-forming gas. For forming the coating film in amorphous phase, in a mixture of crystalline phase and amorphous phase or in crystalline phase of crystallinity lower than that of the silicon-based thin film, there can be employed, for example, a method of reducing the flow rate of diluting gas in case the film forming gas contains silane-based gas such as $SiH_4$ or $Si_2H_6$. It is also effective to form the coating film at a temperature lower than that for the formation of the silicon-based thin film. However, in order to form a coating film of good adhesion in a region surrounding the plasma generating space in the vacuum vessel, it is preferably to heat, to a certain extent, the region surrounding the plasma generating space in the vacuum vessel. More specifically, it is preferable to maintain the region surrounding the plasma generating space in the vacuum vessel at a temperature within a range from 50° C. to 400° C. and lower than the substrate temperature at the formation of the silicon-based thin film. Also the coating film preferably contains a suitable amount of hydrogen, in consideration of a fact that the coating film of good adhesion can be formed in the region surrounding the plasma generating space in the vacuum vessel by compensating the dangling bonds or by accelerating the structural relaxation. The hydrogen content of the coating film is preferably within a range of 5 to 40 atomic %.

Another effect of the formation of the aforementioned coating film presumably lies in a catalytic effect for accelerating the deposition reaction. Such effect is not yet clarified in detail, but is presumed to lower the bonding force of unreacted molecules and radicals absorbed in the coating film and to lower the activation energy of the deposition reaction by the chain reaction of such effect.

For achieving high-speed film formation, it is effective to increase the supplied electric power, thereby increasing the decomposition effect of the source gas, but such increase in the supplied electric power may induce generation of excessive ions. Since ions are accelerated by the electrostatic attractive force in the sheath region, such excessive ions hinder formation of the silicon-based thin film of high quality, for example, by distorting the crystal lattice by impact of ions to the deposited film or by causing voids in the deposited film, and may also induce an adverse effect such as deteriorating the adhesion to the underlying layer or the environmental resistance. If plasma is generated under a high-pressure condition, the ions in the plasma have increased opportunities of collision with other ions and active species thereby presumably reducing the ion impact to the substrate and activating the reaction of hydrogen radicals in the vicinity of the substrate surface. As a result of intensive investigation, the present inventors have found that the pressure is preferably 50 mTorr (6.7 Pa) or more, more preferably 750 mTorr (100 Pa) or more in order to form a silicon-based thin film of high quality with good orientation and crystallinity at a high speed, particularly in consideration of the effect of reducing ion damage.

In the following there will be explained the constituents of a photovoltaic element of the present invention.

FIG. 1 is a schematic cross-sectional view showing an example of the photovoltaic element of the present invention, wherein shown are a substrate 101, a semiconductor layer 102, a second transparent conductive layer 103, and a current-collecting electrode 104. There are also shown a support member 101-1, a metal layer 101-2, a first transparent conductive layer 101-3, which are constituents of the substrate 101.

Support Member

As the support member 101-1, there can be employed a plate-shaped or sheet-shaped member advantageously composed of a metal, a resin material, ceramics, a semiconductor bulk, etc. The support member may have a surface with fine irregularities. Also, a transparent substrate may be employed to achieve a configuration where the light enters through the support member. Also the support member may be shaped in a long form to perform continuous film formation by the roll-to-roll process. In particular, a flexible material such as stainless steel or polyimide is advantageous for use as the support member 101-1.

Metal Layer

The metal layer 101-2 has a function as an electrode and a function as a reflective layer for reflecting the light reaching the support member 101-1 for re-utilization in the semiconductor layer 102. It may be preferably composed of Al, Cu, Ag, Au, CuMg, AlSi or the like. It may be preferably formed by evaporation, sputtering, electrodeposition, printing or the like. The metal layer 101-2 preferably has a surface with irregularities. In this manner, it is rendered possible to extend the optical path length of the reflected light in the semiconductor layer 102 and to increase the shortcircuit current. In case the support member 101-1 is electroconductive, the metal layer 101-2 may be omitted.

First Transparent Conductive Layer

The first transparent conductive layer 101-3 has functions of increasing the random reflection of the incident light and reflected light, and extending the optical path length in the semiconductor layer 102. It also has a function of preventing that the element of the metal layer 101-2 diffuses or migrates to the semiconductor layer 102 thereby causing a shunt in the photovoltaic element. It also has a suitable resistance thereby preventing shortcircuiting caused by a defect such as a pinhole in the semiconductor layer. Furthermore, the first transparent conductive layer 101-3 preferably has a surface with irregularities similarly as in the case of the metal layer 101-2. The first transparent conductive layer 101-3 is preferably composed of a conductive oxide such as ZnO or ITO, and is preferably formed by evaporation, sputtering, CVD or electrodeposition. Such conductive oxide may be added with a substance for varying the conductivity.

The zinc oxide layer is preferably formed by sputtering, electrodeposition or the like.

In case of forming the zinc oxide film by sputtering, the condition is significantly affected by the sputtering method, kind of employed gas and flow rate thereof, internal pressure, supplied electric power, film forming rate, substrate temperature, etc. For example, in case of forming the zinc oxide film by DC magnetron sputtering employing a zinc oxide target, the gas to be employed can be, for example, Ar, Ne, Kr, Xe, Hg or $O_2$, and the flow rate varies depending on the size of the apparatus and the gas exhausting rate, but the flow rate is preferably within a range of 1 to 100 sccm in case the film forming space has a volume of 20 liters. Also the internal pressure at the film formation is preferably within a range from $1 \times 10^{-4}$ Torr ($133 \times 10^{-4}$ Pa) to 0.1 Torr (13 Pa). The supplied electric power depends on the size of the target, but is preferably within a range from 10 W to 100 kW in case the target has a diameter of 15 cm. Also the substrate temperature has variable preferable range depending on the film forming rate, but is preferably within a range of 70° C. to 450° C. in case of a film forming rate of 1 μm/hour.

Also in case of forming the zinc oxide film by electrodeposition, there is preferably employing aqueous solution containing nitrate ions and zinc ions in an anticorrosive container. The concentration of the nitrate and zinc ions is preferably within a range of 0.001 to 1.0 mol/liter, more preferably 0.01 to 0.5 mol/liter and most preferably 0.1 to 0.25 mol/liter. The supply source for nitrate and zinc ions is not particularly limited, and can be for example zinc nitrate constituting the supply source of both ions or a mixture of a water-soluble nitrate salt such as ammonium nitrate constituting the supply source of nitrate ions and a zinc salt such as zinc sulfate constituting the supply source of zinc ions.

It is also preferable to add, to such aqueous solution, a hydrocarbon for suppressing the abnormal growth and improving the adhesion property. The kind of the hydrocarbon is not particularly limited, but can be a monosaccharide such as glucose or fructose, disaccharide such as maltose or saccharose, a polysaccharide such as dextrin or starch, or a mixture thereof. The amount of hydrocarbon in the aqueous solution is variable depending on the kind of hydrocarbon but is in general preferably within a range of 0.001 to 300 g/liter, more preferably 0.005 to 100 g/liter, and most preferably 0.01 to 60 g/liter.

In case of forming the zinc oxide film by electrodeposition, it is preferable to constitute a cathode by the support member on which the zinc oxide film is to be deposited, and an anode by zinc, platinum or carbon in the aforementioned aqueous solution. The current density flowing through a load resistor is preferably within a range from 10 mA/dm$^2$ to 10 A/dm$^2$.

Substrate

The substrate 101 is formed by depositing the metal layer 101-2 and the first transparent conductive layer 101-3 according to the necessity on the support member 101-1 by the above-described methods. Also in order to facilitate the integration of the elements, the substrate 101 may be provided with an insulating layer as an intermediate layer.

Semiconductor Layer

The silicon-based thin film and the semiconductor layer 102 of the present invention are mainly composed of Si of amorphous phase, crystalline phase or a mixed phase. Si may be replaced by an alloy of Si with C or Ge. The semiconductor layer 102 also contains hydrogen and/or halogen atoms, with a preferred content of 0.1 to 40 atomic %. The semiconductor layer 102 may also contain oxygen, nitrogen, etc.

The semiconductor layer may be rendered p-type or n-type by respectively containing an element of group III or V of the periodic table. As the electric characteristics, such p-type or n-type layer preferably has an activation energy of 0.2 eV or less, optimally 0.1 eV or less. Also the specific resistivity is preferably 100 Ωcm or less, optimally 1 Ωcm or less. In case of a stack cell (photovoltaic element with a plurality of pin junctions), it is preferable that the band gap is wider in the i-type semiconductor layer of a pin junction closer to the light entrance side and becomes narrower as the pin junction becomes farther from the light entrance side. Also inside the i-type layer, the minimum value of the band gap is preferably present at the side of the p-type layer with respect to the center of the thickness of the i-type layer.

The doped layer (p-type or n-type layer) at the light entrance side is advantageously composed of a crystalline semiconductor with low light absorption or a semiconductor with a wide band gap. As an example of a stack cell with two stacked sets of pin junctions consisting of a combination of i-type silicon-based semiconductor layers, the stack cell may be composed of, from the light entrance side, (an amorphous semiconductor layer, a semiconductor layer containing crystalline phase) and (a semiconductor layer containing crystalline phase, a semiconductor layer containing crystalline phase).

Also as an example of stack cell with three sets of pin junctions consisting of a combination of i-type silicon-based semiconductor layers, the stack cell may be composed of, from the light entrance side, (an amorphous semiconductor layer, an amorphous semiconductor layer, a semiconductor layer containing crystalline phase), (an amorphous semiconductor layer, a semiconductor layer containing crystalline phases, a semiconductor layer containing crystalline phase), and (a semiconductor layer containing crystalline phase, a semiconductor layer containing crystalline phase, a semiconductor layer containing crystalline phase). The i-type semiconductor layer preferably has a light absorption coefficient ($\alpha$) of 5000 cm$^{-1}$ or more of light (630 nm), a photoconductivity ($\sigma p$) of $10 \times 10^{-5}$ S/cm or more under light irradiation by a solar simulator (AM 1.5, 100 mW/cm$^2$), a dark conductivity ($\sigma d$) of $10 \times 10^{-6}$ S/cm or less, and an Urbach energy of 55 meV or less by the constant photocurrent method (CPM). There may also be employed an i-type semiconductor layer which is slightly p-type or n-type.

Figure 3:
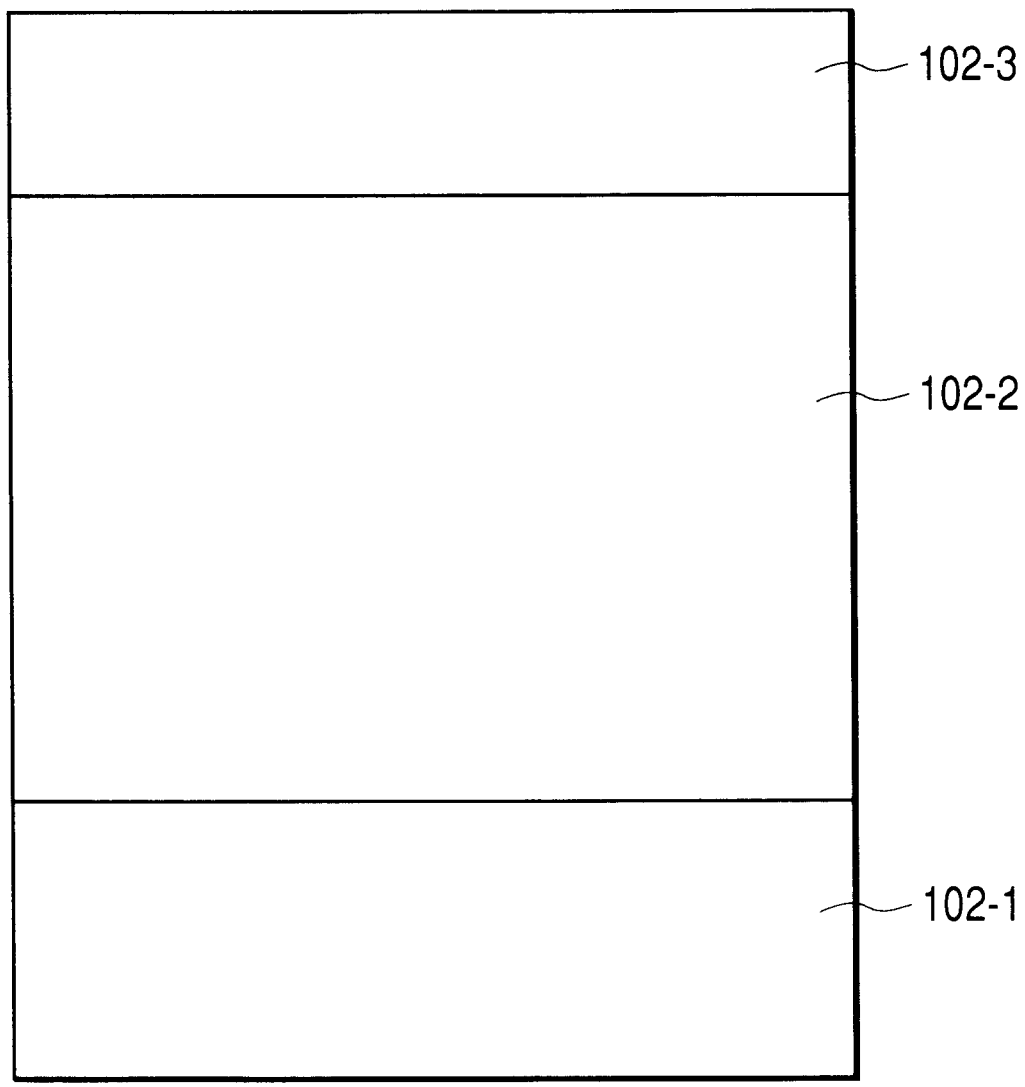
FIG. 3 is a schematic cross-sectional view showing an example of semiconductor layers of the present invention.

In the following there will be given further explanation on the semiconductor layer 102 which is a constituent of the present invention. FIG. 3 is a schematic cross-sectional view showing a semiconductor layer 102 having a set of pin junction in an example of the photovoltaic element of the present invention, and consisting of an i-type semiconductor layer 102-1 having a first conductivity type and containing crystalline phase, an i-type semiconductor layer 102-2 containing crystalline phase and consisting of a silicon-based thin film of the present invention, and a non-single-crystalline semiconductor layer 102-3 having a second conductivity type which are stacked. In case of a semiconductor layer having a plurality of sets of pin junctions, at least one thereof preferably has the above-described configuration. Also between the i-type semiconductor layer 102-2 containing crystalline phase consisting of the silicon-based thin film of the present invention and the semiconductor layer having either conductivity type, an amorphous layer may be interposed.

Method for Forming Semiconductor Layer

High frequency plasma CVD process is suitable for forming the silicon-based thin film of the present invention and the semiconductor layer 102. In the following there will be explained an example of the procedure for forming the semiconductor layer 102 by the high frequency plasma CVD:

(1) The interior of a semiconductor forming vacuum vessel that can be evacuated is set to a predetermined deposition pressure;

(2) Gasses such as source gas, diluting gas etc. are introduced into the deposition chamber, and the interior thereof is set at the predetermined deposition pressure under evacuation by a vacuum pump;

(3) A substrate 101 is set at a predetermined temperature by a heater;

(4) High frequency wave oscillated by a high frequency source is introduced into the deposition chamber. The introduction into the deposition chamber may be achieved by guiding the high frequency wave by a wave guide tube and introducing it into the deposition chamber through a dielectric window consisting of alumina ceramics or the like, or guiding the high frequency wave by a coaxial cable and introducing it into the deposition chamber through a metal electrode; and (5) Plasma is generated in the deposition chamber to decompose the source gas, thereby forming a deposition film on the substrate 101 positioned in the deposition chamber. If necessary, this procedure is repeated plural times to form the semiconductor layer 102.

For example, preferred forming conditions for the silicon-based thin film and the semiconductor layer 102 of the present invention include a substrate temperature in the deposition chamber of 100° C. to 450° C., a pressure of 0.5 mTorr (67 mPa) to 10 Torr ($1.3 \times 10^3$ Pa), and a high frequency power density of 0.001 to 1 W/cm$^3$ (supplied electric power/deposition chamber volume).

As the source gas for forming the silicon-based thin film and the semiconductor layer 102 of the present invention, there may be employed a gasifiable compound containing silicon atom such as $SiH_4$ or $Si_2H_6$, or a silicon halide such as $SiF_4$, $Si_2F_6$, $SiH_2F_2$, $SiH_2Cl_2$, $SiCl_4$ or $Si_2Cl_6$. The compound in gaseous phase at room temperature is supplied from a gas container, and the compound in liquid phase is used by bubbling with inert gas. In case of forming an alloy-based film, it is desirable to add, to the source gas, a gasifiable compound containing Ge or C, such as $GeH_4$ or $CH_4$.

The source gas is introduced into the deposition chamber preferably under dilution with diluting gas, which can be $H_2$ or He. Also a gasifiable compound containing nitrogen, oxygen etc. may be added to the source gas or the diluting gas. For obtaining p-type semiconductor layer, there can be employed a dopant gas such as $B_2H_6$ or $BF_3$. Also for obtaining n-type semiconductor layer, there can be employed a dopant gas such as $PH_3$ or $PF_3$. In case of depositing a thin film of crystalline phase or a layer with low light absorption or with a wide band gap such as SiC, it is preferable to increase the proportion of the diluting gas with respect to the source gas and to introduce the high frequency wave of a relatively high power density.

Also, before forming the silicon-based thin film of the present invention, a coating film of a resistivity higher than that of the semiconductor forming vacuum vessel is formed in a region surrounding the plasma generating space within the vacuum vessel. Such coating film can be advantageously formed by high frequency plasma CVD process similarly as in the case of the semiconductor layer 102. In order to form a sheath having a large electric field in the vicinity of the semiconductor forming vacuum vessel, the coating film preferably has a thickness of 1 μm or more.

The coating-film-forming gas for forming the coating film is preferably composed principally of a silicon-containing gas such as $SiH_4$, $Si_2H_6$ or $SiF_4$, having a large deposition effect, with a diluting gas such as $H_2$ or He. The coating film can be, as explained in the foregoing, of amorphous phase, crystalline phase or mixed phase containing crystalline and amorphous phases.

Second Transparent Conductive Layer

The second transparent conductive layer 103 constitutes an electrode of the light entrance side and may also serve as an antireflective film with suitable adjustment of the film thickness. The second transparent conductive layer is required to have a high transmittance in a wavelength region absorbable by the semiconductor layer 102 and a low resistivity. The transmittance at 550 nm is preferably 80% or more, more preferably 85% or more. The resistivity is preferably $5 \times 10^{-3}$ Ωcm or less, more preferably $1 \times 10^{-3}$ Ωcm or less.

The second transparent conductive layer 103 can be preferably composed of ITO, ZnO or $In_2O_3$, and can be preferably formed by evaporation, CVD, spray coating, spin coating or dip coating. A substance for varying the conductivity may be added to the above-mentioned materials.

Current Collecting Electrode

The current-collecting electrode 104 is provided on the transparent electrode 103 in order to improve the current-collecting efficiency. It can be preferably formed by a method of forming a metal in the electrode pattern by sputtering with a mask, a method of printing a conductive paste or solder paste, or a method of fixing a metal wire with a conductive paste.

If necessary, protective layers may be formed on both sides of the photovoltaic element. Also a reinforcing member such as a steel plate may be employed on the surfaces (light entrance side and opposite side) of the photovoltaic element.

In the following there will be explained examples of the present invention, taking a solar cell as the example of the photovoltaic element, but such examples by no means limit the content of the present invention.

EXAMPLE 1

Figure 2:
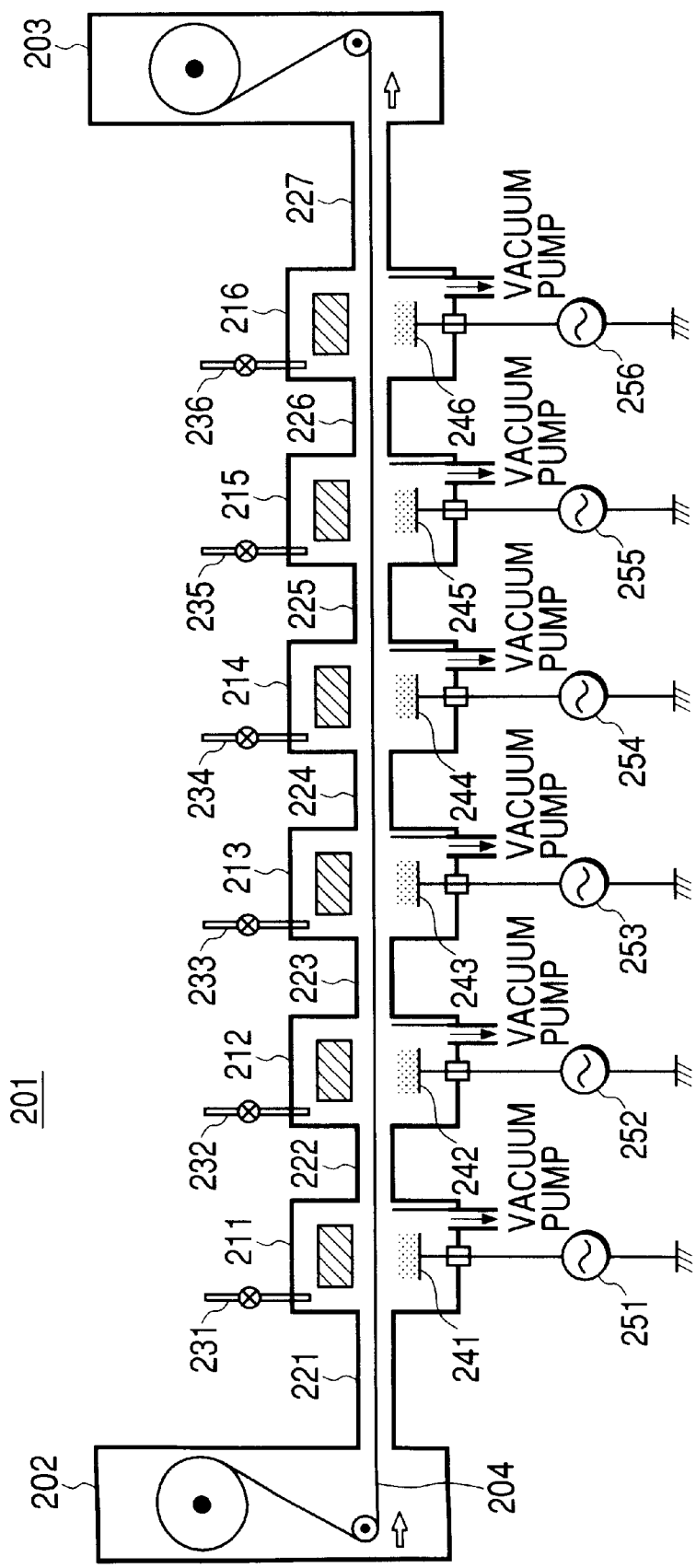
FIG. 2 is a schematic cross-sectional view showing an example of a deposition film forming apparatus employed for producing the silicon-based thin film and the photovoltaic element of the present invention.

The silicon-based thin film was formed by the following procedure with a deposition film forming apparatus 201 shown in FIG. 2.

FIG. 2 is a schematic cross-sectional view showing an example of the deposition film forming apparatus for producing the silicon-based thin film and the photovoltaic element of the present invention. The deposition film forming apparatus 201 shown in FIG. 2 is composed of a substrate feeding container 202, semiconductor forming vacuum vessels 211 to 216, and a substrate wind-up container 203 mutually connected through gas gates 221 to 227. In the deposition film forming apparatus 201, a belt-shaped conductive substrate 204 is set through the vessels and the gas gates. The belt-shaped conductive substrate 204 is fed from a bobbin provided in the substrate feeding container 202, and is wound up on another bobbin in the substrate wind-up container 203.

The semiconductor forming vacuum vessels 211 to 216 are respectively provided with deposition chambers in which high frequency electric powers are applied from high frequency sources 251 to 256 to high frequency introducing portions 241 to 246 to generate glow discharge, thereby decomposing the source gas to deposit semiconductor layers on the conductive substrate 204. The semiconductor forming vacuum vessels 211 to 216 are also respectively provided with gas introducing pipes 231 to 236 for introducing a source gas and a diluting gas.

The deposition film forming apparatus 201 shown in FIG. 2 is provided with six semiconductor forming vacuum vessels, but, in the following examples, it is not necessary to generate the glow discharge in all the vessels and the presence or absence of the glow discharge can be selected in each vessel according to the layer configuration of the photovoltaic element to be formed. Also each semiconductor forming vacuum vessel is provided with a film forming region adjusting plate (not shown in the drawings) for adjusting the contact area between the conductive substrate 204 and the discharge space in each deposition chamber, and the thickness of the semiconductor film formed in each vessel can be regulated by adjusting such adjusting plate.

At first a belt-shaped substrate (width 40 cm, length 200 m, thickness 0.125 mm) consisting of stainless steel (SUS430BA) was sufficiently degreased and rinsed, then mounted in a continuous sputtering apparatus not shown in the drawings, and was subjected to the sputtering of a thin Ag film with a thickness of 100 nm employing an Ag target. Then a thin ZnO film having a thickness of 1.2 μm was sputtered on the thin Ag film, employing a ZnO target, thereby forming a belt-shaped conductive substrate 204.

Then the conductive substrate 204 wound on a bobbin was mounted in the substrate feeding container 202, then was passed through the gas gate of the entrance side, the semiconductor forming vacuum vessels 211, 212, 213, 214, 215, 216 and the gas gate of the exit side to the substrate wind-up container 203, and was subjected to tension control so that the substrate 204 was not slack. Then the substrate feeding container 202, semiconductor forming vacuum vessels 211 to 216 and the substrate wind-up container 203 were sufficiently evacuated to $5 \times 10^{-6}$ Torr ($6.7 \times 10^{-4}$ Pa) or lower by an evacuating system including a vacuum pump not shown in the drawings.

Then, under the operation of the evacuating system, $SiH_4$ at 30 sccm and $H_2$ at 500 sccm were introduced as the coating-film-forming gas into the semiconductor forming vacuum vessel 212 through the gas introducing pipe 232.

Also $H_2$ gas at 200 sccm was supplied from the gas introducing pipes into the semiconductor forming vacuum vessels other than the vessel 212, and $H_2$ gas at 500 sccm was simultaneously supplied as a gate gas to each gas gate from a gate gas supply pipe not shown in the drawings. In this state the evacuating power of the evacuating system was regulated to adjust the pressure in the semiconductor forming vacuum vessel 212 to 200 mTorr (27 Pa).

When the internal pressure of the semiconductor forming vacuum vessel 212 was stabilized, high frequency electric power of a frequency of 60 MHz and a power density of 100 mW/cm$^3$ was introduced from the high frequency source 252 to the high frequency introducing portion 242 of the vacuum vessel 212, and the region surrounding the plasma generating space in the vacuum vessel was maintained at 150° C. to generate glow discharge in the deposition chamber of the semiconductor forming vacuum vessel 212, thereby forming a coating film of amorphous silicon in the region surrounding the plasma generating space in the vacuum vessel. The coating film was formed with a thickness of 2 μm in a portion farthest (thinnest portion) from the high frequency introducing portion 242.

After the coating film formation, the introduction of high frequency and a coating-film-forming gas was terminated. Thereafter, a source gas was supplied from the gas introducing pipe 232 to the semiconductor forming vacuum vessel 212. Also, similarly as in the film formation, $H_2$ gas at 200 sccm was supplied from the gas introducing pipes into the semiconductor forming vacuum vessels other than the vessel 212, and $H_2$ gas at 500 sccm was simultaneously supplied as a gate gas to each gas gate from a gate gas supply pipe not shown in the drawings. In this state the evacuating power of the evacuating system was regulated to adjust the pressure in the semiconductor forming vacuum vessel 212 to a desired value. The forming conditions are shown in Table 1.

When the internal pressure of the semiconductor forming vacuum vessel 212 was stabilized, the feeding of the conductive substrate 204 was started from the substrate feeding container 202 toward the substrate wind-up container 203.

Then high frequency electric power was introduced from the high frequency source 252 to the high frequency introducing portion 242 of the vacuum vessel 212, and glow discharge was generated in the deposition chamber of the semiconductor forming vacuum vessel 212, thereby forming a silicon-based film on the conductive substrate 204 (Example 1). In this operation, high frequency electric power of a frequency of 60 MHz and a power density of 400 mW/cm$^3$ was introduced into the vacuum vessel 212 from the high frequency introducing portion 242.

Then, a region adjacent to the plasma in the semiconductor forming vacuum vessel 212 was subjected to honing for removing the deposited film, and glow discharge was generated in the deposition chamber of the semiconductor forming vacuum vessel 212 under the same conditions as in Example 1, except that the coating film formation was not executed, and this state was held for the same time as in Example 1 (Comparative Example 1).

A silicon-based thin film of a thickness of 1.5 μm was formed on the substrate in Example 1, but no silicon-based thin film was formed on the substrate in Comparative Example 1. The silicon-based thin film formed in Example 1 was subjected to the measurement of the diffraction peak by CuKα line in an X-ray diffraction apparatus to investigate the proportion of the (220) diffraction intensity to the total diffraction intensity. Also the Scherrer radius was determined from the half-peak value of the diffraction peak of the (220) reflection. As a result, the proportion of the (220) diffraction intensity to the total diffraction intensity was 90%, and the Scherrer radius was 40 nm. Also the silicon-based thin film prepared in Example 1 was subjected to the measurement of Raman scattering spectrum for investigating the ratio of Raman intensities between around 520 cm$^{-1}$ (resulting from crystalline component) and around 480 cm$^{-1}$ (resulting from amorphous component). As a result, the Raman scattering intensity resulting from the crystalline component was 20 times the Raman scattering intensity resulting from the amorphous component.

These results indicate that the conditions of Example 1 enable deposition of the silicon-based thin film that cannot be deposited under the conditions of Comparative Example 1, and the silicon-based thin film formed in Example 1 is excellent in the orientation of (220) plane, crystal grain size and crystallinity, and that the forming method of the present invention for silicon-based thin film has excellent features.

EXAMPLE 2

The silicon-based thin film was formed by the following procedure with the deposition film forming apparatus 201 shown in FIG. 2.

A belt-shaped conductive substrate 204 was prepared similarly as in Example 1 and mounted in the deposition film forming apparatus 201, and the substrate feeding container 202, the semiconductor forming vacuum vessels 211 to 216 and the substrate wind-up container 203 were sufficiently evacuated to $5 \times 10^{-6}$ Torr ($6.7 \times 10^{-4}$ Pa) or lower by an evacuating system including a vacuum pump not shown in the drawings.

Then, under the operation of the evacuating system, $SiH_4$ at 30 sccm and $H_2$ at 500 sccm were introduced as the coating-film-forming gas into the semiconductor forming vacuum vessel 212 through the gas introducing pipe 232.

Also $H_2$ gas at 200 sccm was supplied from the gas introducing pipes into the semiconductor forming vacuum vessels other than the vessel 212, and $H_2$ gas at 500 sccm was simultaneously supplied as a gate gas to each gas gate from a gate gas supply pipe not shown in the drawings. In this state the evacuating power of the evacuating system was regulated to adjust the pressure in the semiconductor forming vacuum vessel 212 to 200 mTorr (27 Pa).

When the internal pressure of the semiconductor forming vacuum vessel 212 was stabilized, high frequency electric power of a frequency of 60 MHz and a power density of 100 mW/cm$^3$ was introduced from the high frequency source 252 to the high frequency introducing portion 242 of the vacuum vessel 212, and the region surrounding the plasma generating space in the vacuum vessel was maintained at 150° C. to generate glow discharge in the deposition chamber of the semiconductor forming vacuum vessel 212, thereby forming a coating film of amorphous silicon in the region surrounding the plasma generating space in the vacuum vessel. The coating film was formed with a thickness of 2 μm in a portion farthest (thinnest portion) from the high frequency introducing portion 242.

After the coating film formation, the introduction of high frequency and a coating-film-forming gas was terminated. Thereafter, a source gas was supplied from the gas introducing pipe 232 to the semiconductor forming vacuum vessel 212. Also, similarly as in the coating film formation, H$_2$ gas at 200 sccm was supplied from the gas introducing pipes into the semiconductor forming vacuum vessels other than the vessel 212, and H$_2$ gas at 500 sccm was simultaneously supplied as a gate gas to each gas gate from a gate gas supply pipe not shown in the drawings. In this state the evacuating power of the evacuating system was regulated to adjust the pressure in the semiconductor forming vacuum vessel 212 to a desired value. The forming conditions are shown in Table 2.

When the internal pressure of the semiconductor forming vacuum vessel 212 was stabilized, the feeding of the conductive substrate 204 was started from the substrate feeding container 202 toward the substrate wind-up container 203.

Then high frequency electric power was introduced from the high frequency source 252 to the high frequency introducing portion 242 of the vacuum vessel 212, and glow discharge was generated in the deposition chamber of the semiconductor forming vacuum vessel 212, thereby forming a silicon-based film on the conductive substrate 204 (Example 2). In this operation, high frequency electric power of a frequency of 60 MHz and a power density of 300 mW/cm$^3$ was introduced into the vacuum vessel 212 through the high frequency introducing portion 242.

Then, a region adjacent to the plasma in the semiconductor forming vacuum vessel 212 was subjected to honing for removing the deposited film, and glow discharge was generated in the deposition chamber of the semiconductor forming vacuum vessel 212 under the same conditions as in Example 1, except that the coating film formation was not executed, and this state was held for the same time as in Example 1 (Comparative Example 2).

A silicon-based thin film of a thickness of 2.0 μm was formed on the substrate in Example 2, but a silicon-based thin film of a thickness of 0.3 μm was formed on the substrate in Comparative Example 2. The silicon-based thin films formed in Example 2 and Comparative Example 2 were subjected to the measurement of the diffraction peak by CuKα line in an X-ray diffraction apparatus to investigate the proportion of the (220) diffraction intensity to the total diffraction intensity. Also the Scherrer radius was determined from the half-peak value of the diffraction peak of the (220) reflection. Also the silicon-based thin films prepared in Example 2 and Comparative Example 2 were subjected to the measurement of Raman scattering spectrum for investigating the ratio of Raman intensities between around 520 cm$^{-1}$ (resulting from crystalline component) and around 480 cm$^{-1}$ (resulting from amorphous component). The results obtained are shown in Table 3.

These results indicate that the conditions of Example 2 enable faster deposition of the silicon-based thin film than under the conditions of Comparative Example 2, and the silicon-based thin film formed in Example 2 is excellent in the orientation of (220) plane, crystal grain size and crystallinity, and that the forming method of the present invention for silicon-based thin film has excellent features.

EXAMPLE 3

Figure 4:
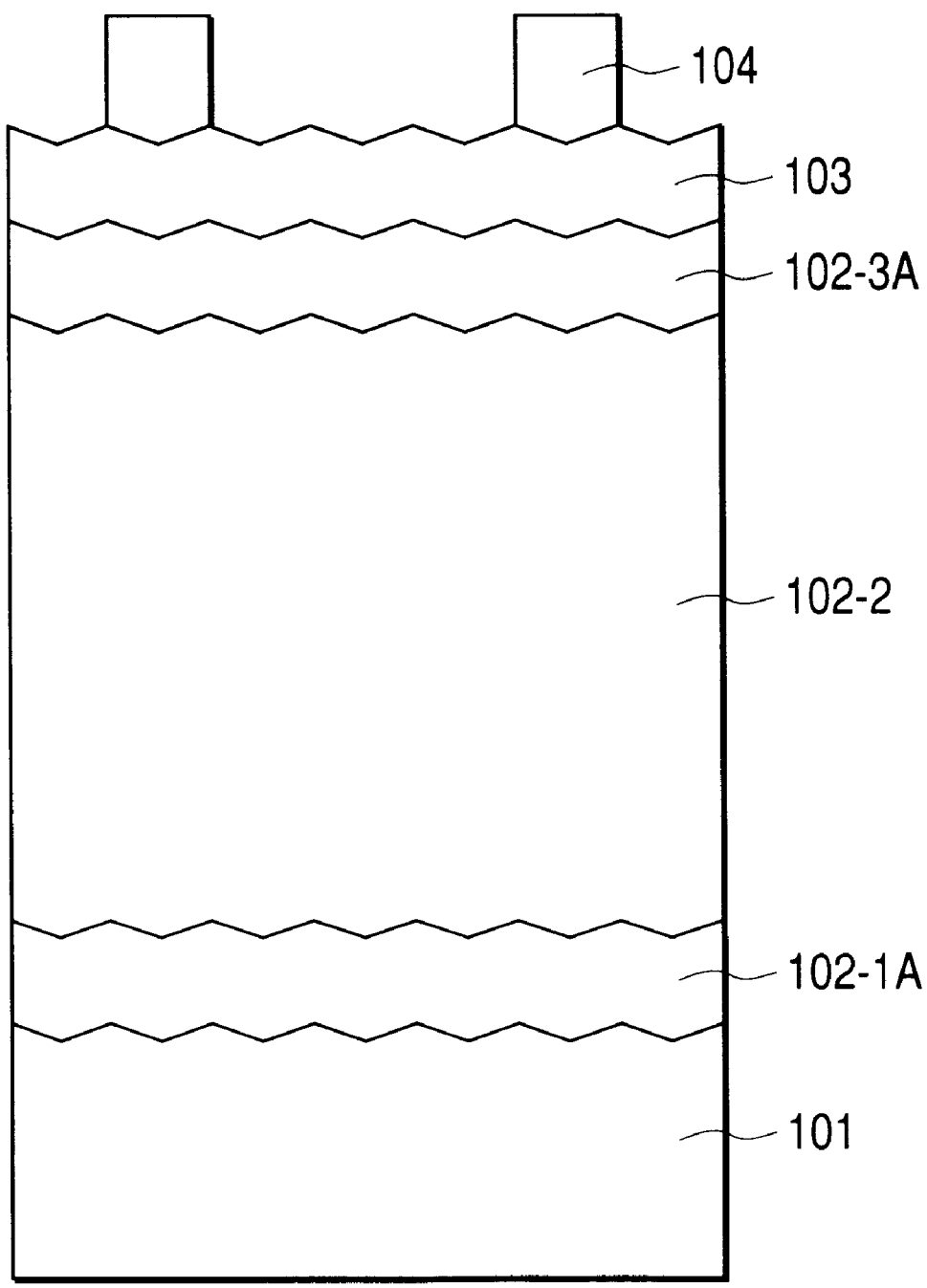
FIGS. 4 and 5 are schematic cross-sectional views showing examples of the photovoltaic element including the silicon-based thin film of the present invention.

A pin-type photovoltaic element shown in FIG. 4 was formed by the following procedure with the deposition film forming apparatus 201 shown in FIG. 2. FIG. 4 is a schematic cross-sectional view showing an example of the photovoltaic element including a silicon-based thin film of the present invention, wherein the same components as those in FIG. 1 are represented by the same numbers and will not be explained further. The semiconductor layer of this photovoltaic element is composed of an amorphous n-type semiconductor layer 102-1A, an i-type semiconductor layer 102-2 containing crystalline phase, and a microcrystalline p-type semiconductor layer 102-3A. Thus, this photovoltaic element is so-called pin type single-cell photovoltaic element.

A belt-shaped conductive substrate 204 was prepared similarly as in Example 1, and mounted on the deposition film forming apparatus 201, and the substrate feeding container 202, the semiconductor forming vacuum vessels 211 to 216 and the substrate wind-up container 203 were sufficiently evacuated to 5×10$^{-6}$ Torr (6.7×10$^{-4}$ Pa) or lower by an evacuating system including a vacuum pump not shown in the drawings.

Then, under the operation of the evacuating system, SiH$_4$ at 30 sccm and H$_2$ at 500 sccm were introduced as the coating-film-forming gas into the semiconductor forming vacuum vessel 212 through the gas introducing pipe 232.

Also H$_2$ gas at 200 sccm was supplied from the gas introducing pipes into the semiconductor forming vacuum vessels other than the vessel 212, and H$_2$ gas at 500 sccm was simultaneously supplied as gate gas to each gas gate from a gate gas supply pipe not shown in the drawings. In this state the evacuating power of the evacuating system was regulated to adjust the pressure in the semiconductor forming vacuum vessel 212 to 200 mTorr (27 Pa).

When the internal pressure of the semiconductor forming vacuum vessel 212 was stabilized, high frequency electric power of a frequency of 60 MHz and a power density of 100 mW/cm$^3$ was introduced from the high frequency source 252 to the high frequency introducing portion 242 of the vacuum vessel 212, and the region surrounding the plasma generating space in the vacuum vessel was maintained at 150° C. to generate glow discharge in the deposition chamber of the semiconductor forming vacuum vessel 212, thereby forming a coating film of amorphous silicon in the region surrounding the plasma generating space in the vacuum vessel. The coating film was formed with a thickness of 2 μm in a portion farthest (thinnest portion) from the high frequency introducing portion 242.

Then, under the operation of the evacuating system, a source gas and a diluting gas were introduced into the semiconductor forming vacuum vessels 211 to 213 through the gas introducing pipes 231 to 233.

Also H$_2$ gas at 200 sccm was supplied from the gas introducing pipes into the semiconductor forming vacuum vessels other than the vessels 211 to 213, and H2 gas at 500 sccm was simultaneously supplied as gate gas to each gas gate from a gate gas supply pipe not shown in the drawings. In this state the evacuating power of the evacuating system was regulated to adjust the pressure in the semiconductor forming vacuum vessels 211 to 213 to a desired value. The forming conditions are shown in Table 4.

When the internal pressures of the semiconductor forming vacuum vessels 211 to 213 were stabilized, the feeding of the conductive substrate 204 was started from the substrate feeding container 202 toward the substrate wind-up container 203.

Then high frequency electric power was introduced from the high frequency sources 251 to 253 to the high frequency introducing portions 241 to 243 of the vacuum vessels 211 to 213, and glow discharges were generated in the deposition chambers of the semiconductor forming vacuum vessels 211 to 213, thereby forming an amorphous n-type semiconductor layer (30 nm thick), an i-type semiconductor layer containing crystalline phase (1.5 μm) and a microcrystalline p-type semiconductor layer (10 nm thick) on the conductive substrate 204, thus completing a photovoltaic element. In this operation, high frequency electric power of a frequency of 13.56 MHz and a power density of 5 mW/cm$^3$ was introduced into the vacuum vessel 211 through the high frequency introducing portion 241, the power of a frequency of 60 MHz and a power density of 300 mW/cm$^3$ was introduced into the vacuum vessel 212 through the high frequency introducing portion 242, and the power of a frequency of 13.56 MHz and a power density of 30 mW/cm$^3$ was introduced into the vacuum vessel 213 through the high frequency introducing portion 243. Then a continuous module forming apparatus not shown in the drawings was employed to form thus formed belt-shaped photovoltaic element into a solar cell module of 36 cm×22 cm (Example 3).

Then, a region adjacent to the plasma in the semiconductor forming vacuum vessel 212 was subjected to honing for removing the deposited film, and a pin-type single-cell photovoltaic element was prepared in the same manner as in Example 3, except that the coating film formation was not executed, and a solar cell module was formed in the same manner as in Example 3 (Comparative Example 3). In this operation, since the deposition rate is lower in the formation of the i-type semiconductor layer of Comparative Example 3 than in Example 3, the same film thickness was obtained by increasing the length of the aperture.

The photoelectric conversion efficiency of the solar cell modules prepared in Example 3 and Comparative Example 3 was measured with a solar simulator (AM 1.5, 100 mW/cm$^3$). When the photoelectric conversion efficiency of the solar cell module of Example 3 was normalized as 1, the photoelectric conversion efficiency of the Comparative Example 3 was 0.85.

Also the adhesion property between the conductive substrate and the semiconductor layer was investigated by a cross cut tape test (gap of 1 mm between cuts, and 100 squares in total). Also the change in the photoelectric conversion efficiency in a cyclic temperature-moisture test was investigated by maintaining a solar cell module, which is subjected in advance to the measure of the initial photoelectric conversion efficiency, for 30 minutes in a dark place of a temperature of 85° C. and a humidity of 85%, then lowering the temperature to −20° C. over 70 minutes and maintaining this temperature for 30 minutes, then returning to a temperature of 85° C. and a humidity of 85% over 70 minutes and repeating this cycle 100 times, and measuring again the photoelectric conversion efficiency. Also the change in the photoelectric conversion efficiency in a photodeterioration test by subjecting a solar cell module, which is subjected in advance to the measurement of the initial photoelectric conversion efficiency, to the irradiation for 500 hours by solar simulator light of AM 1.5 and 100 mW/cm$^2$ at 50° C. and by measuring again the photoelectric conversion efficiency. The obtained results are shown in Table 5.

The foregoing results indicate that the solar cell module including the photovoltaic element of the present invention has excellent features.

EXAMPLE 4

Figure 5:
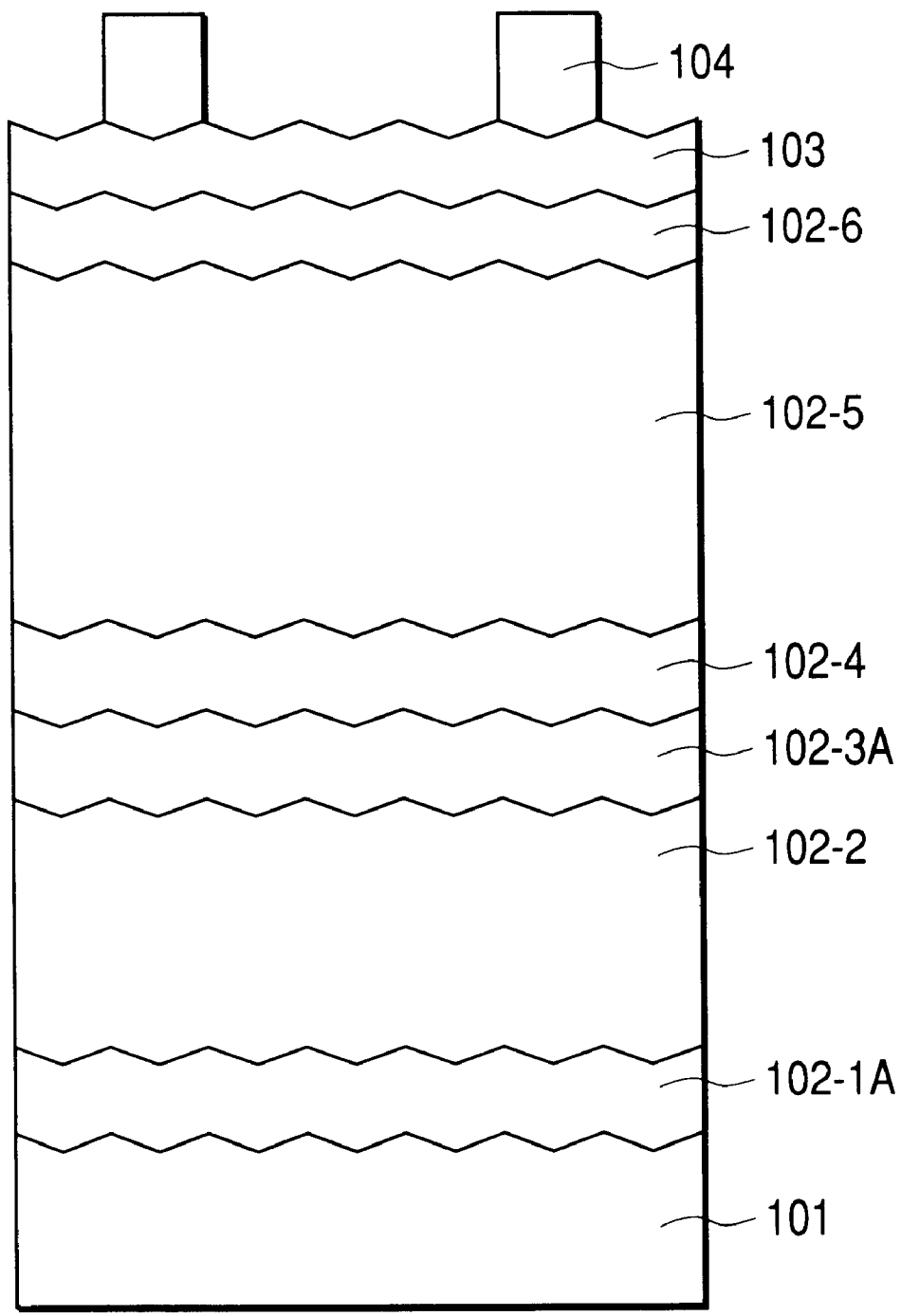

A photovoltaic element shown in FIG. 5 was formed by the following procedure with the deposition film forming apparatus 201 shown in FIG. 2. FIG. 5 is a schematic cross-sectional view showing an example of the photovoltaic element including a silicon-based thin film of the present invention, wherein the same components as those in FIG. 1 are represented by the same numbers and will not be explained further. The semiconductor layer of this photovoltaic element is composed of an amorphous n-type semiconductor layer 102-1A, an i-type semiconductor layer 102-2 containing crystalline phase, a microcrystalline p-type semiconductor layer 102-3A, an amorphous n-type semiconductor layer 102-4, an amorphous i-type semiconductor layer 102-5 and a microcrystalline p-type semiconductor layer 102-6. Thus, this photovoltaic element is so-called pinpin type double-cell photovoltaic element.

A belt-shaped conductive substrate 204 was prepared similarly as in Example 1, and mounted on the deposition film forming apparatus 201, and the substrate feeding container 202, the semiconductor forming vacuum vessels 211 to 216 and the substrate wind-up container 203 were sufficiently evacuated to 5×10$^{-6}$ Torr (6.7×10$^{-4}$ Pa) or lower by an evacuating system including a vacuum pump not shown in the drwings.

Then, under the operation of the evacuating system, SiH$_4$ at 30 sccm and H$_2$ at 500 sccm were introduced as the coating-film-forming gas into the semiconductor forming vacuum vessel 212 through the gas introducing pipe 232.

Also H$_2$ gas at 200 sccm was supplied from the gas introducing pipes into the semiconductor forming vacuum vessels other than the vessel 212, and H$_2$ gas at 500 sccm was simultaneously supplied as the gate gas to each gas gate from a gate gas supply pipe not shown in the drawings. In this state the evacuating power of the evacuating system was regulated to adjust the pressure in the semiconductor forming vacuum vessel 212 to 200 mTorr (27 Pa).

When the internal pressure of the semiconductor forming vacuum vessel 212 was stabilized, high frequency electric power of a frequency of 60 MHz and a power density of 100 mW/cm$^3$ was introduced from the high frequency source 252 to the high frequency introducing portion 242 of the vacuum vessel 212, and the region surrounding the plasma generating space in the vacuum vessel was maintained at 150° C. to generate glow discharge in the deposition chamber of the semiconductor forming vacuum vessel 212, thereby forming a coating film of amorphous silicon in the region surrounding the plasma generating space in the vacuum vessel. The coating film was formed with a thickness of 2 μm in a portion farthest (thinnest portion) from the high frequency introducing portion 242.

Then, under the operation of the evacuating system, a source gas and a diluting gas were introduced into the semiconductor forming vacuum vessels 211 to 216 through the gas introducing pipes 231 to 236.

Also H$_2$ gas at 500 sccm was supplied as the gate gas to each gas gate from a gate gas supply pipe not shown in the drawings. In this state the evacuating power of the evacuating system was regulated to adjust the pressure in the semiconductor forming vacuum vessels 211 to 216 to a desired value. The forming conditions for the bottom cell and the top cell are shown in Table 6.

When the internal pressures of the semiconductor forming vacuum vessels 211 to 216 were stabilized, the feeding of the conductive substrate 204 was started from the substrate feeding container 202 toward the substrate wind-up container 203.

Then high frequency electric power was introduced from the high frequency sources 251 to 256 to the high frequency introducing portions 241 to 246 of the vacuum vessels 211 to 216, and glow discharges were generated in the deposition chambers of the semiconductor forming vacuum vessels 211 to 216, thereby forming an amorphous n-type semiconductor layer (30 nm thick), an i-type semiconductor layer containing crystalline phase (2.0 µm thick) and a microcrystalline p-type semiconductor layer (10 nm thick) on the conductive substrate 204 to form a bottom cell, then forming an amorphous n-type semiconductor layer (30 nm thick), an amorphous i-type semiconductor layer (0.5 µm thick) and a microcrystalline p-type semiconductor layer (10 nm thick) to form a top cell, thereby completing a double-cell photovoltaic element. In this operation, high frequency electric power of a frequency of 13.56 MHz and a power density of 5 mW/cm$^3$ was introduced into the vacuum vessels 211 and 214 through the high frequency introducing portions 241 and 244, the power of a frequency of 60 MHz and a power density of 300 mW/cm$^3$ was introduced into the vacuum vessel 212 through the high frequency introducing portion 242, the power of a frequency of 13.56 MHz and a power density of 30 mW/cm$^3$ was introduced into the vacuum vessels 213 and 216 through the high frequency introducing portions 243 and 246, and the power of a frequency of 13.56 MHz and a power density of 5 mW/cm$^2$ was introduced into the vacuum vessel 215 through the high frequency introducing portion 245. Then a continuous module forming apparatus not shown in the drawings was employed to form thus formed belt-shaped photovoltaic element into a solar cell module of 36 cm×22 cm (Example 4) Then after the measurement of the initial photoelectric conversion efficiency, the solar cell module prepared in Example 4 was maintained at 50° C. and continuously irradiated with the solar simulator light of AM 1.5, 100 mW/cm$^3$, while measuring the photoelectric conversion efficiency from time to time. As a result, the photoelectric conversion efficiency of the solar cell module of Example 4 was 1.2 times that of Example 3. Also the solar cell module of Example 4 was excellent in the adhesion and the durability in the temperature-humidity test and in the photodeterioration test, and the foregoing results indicate that the solar cell module including the photovoltaic element of the present invention has excellent features.

EXAMPLE 5

A silicon-based thin film was formed by the following procedure with the deposition film forming apparatus 201 shown in FIG. 2.

A belt-shaped conductive substrate 204 was prepared similarly as in Example 1 and mounted in the deposition film forming apparatus 201, and the substrate feeding container 202, the semiconductor forming vacuum vessels 211 to 216 and the substrate wind-up container 203 were sufficiently evacuated to 5×10$^{-6}$ Torr (6.7×10$^{-4}$ Pa) or lower by an evacuating system including a vacuum pump not shown in the drawings.

Then, under the operation of the evacuating system, SiH$_4$ at 30 sccm and H$_2$ at 500 sccm were introduced as the coating-film-forming gas into the semiconductor forming vacuum vessel 212 through the gas introducing pipe 232.

Also H$_2$ gas at 200 sccm was supplied from the gas introducing pipes into the semiconductor forming vacuum vessels other than the vessel 212, and H$_2$ gas at 500 sccm was simultaneously supplied as the gate gas to each gas gate from a gate gas supply pipe not shown in the drawings. In this state, the evacuating power of the evacuating system was regulated to adjust the pressure in the semiconductor forming vacuum vessel 212 to 200 mTorr (27 Pa).

When the internal pressure of the semiconductor forming vacuum vessel 212 was stabilized, high frequency electric power of a frequency of 2.45 GHz and a power density of 100 mW/cm$^3$ was introduced from the high frequency source 252 to the high frequency introducing portion 242 of the vacuum vessel 212, and the region surrounding the plasma generating space in the vacuum vessel was maintained at 150° C. to generate glow discharge in the deposition chamber of the semiconductor forming vacuum vessel 212, thereby forming a coating film of amorphous silicon in the region surrounding the plasma generating space in the vacuum vessel. The coating film was formed with a thickness of 2 µm in a portion farthest (thinnest portion) from the high frequency introducing portion 242.

After the coating film formation, the introduction of high frequency and the coating-film-forming gas was terminated. Thereafter, a source gas was supplied from the gas introducing pipe 232 to the semiconductor forming vacuum vessel 212. Also, similarly as in the coating film formation, H$_2$ gas at 200 sccm was supplied from the gas introducing pipes into the semiconductor forming vacuum vessels other than the vessel 212, and H$_2$ gas at 500 sccm was simultaneously supplied as the gate gas to each gas gate from a gate gas supply pipe not shown in the drawings. In this state, the evacuating power of the evacuating system was regulated to adjust the pressure in the semiconductor forming vacuum vessel 212 to a desired value (30 mTorr (4 Pa) in Example 5-1). The forming conditions are shown in Table 7.

When the internal pressure of the semiconductor forming vacuum vessel 212 was stabilized, the feeding of the conductive substrate 204 was started from the substrate feeding container 202 toward the substrate wind-up container 203.

Then high frequency electric power was introduced from the high frequency source 252 to the high frequency introducing portion 242 within the vacuum vessel 212, and glow discharge was generated in the deposition chamber of the semiconductor forming vacuum vessel 212, thereby forming a silicon-based film on the conductive substrate 204 (Example 5-1). In this operation, high frequency electric power of a frequency of 60 MHz and a power density of 500 mW/cm$^3$ was introduced into the vacuum vessel 212 through the high frequency introducing portion 242. Also silicon-based thin films were similarly formed while changing the pressure as shown in Table 7 (Examples 5-2, 5-3, 5-4).

The silicon-based thin films formed in Examples 5-1, 5-2, 5-3 and 5-4 were subjected to the measurement of the diffraction peak by CuKα line in an X-ray diffraction apparatus to investigate the proportion of the (220) diffraction intensity to the total diffraction intensity. Also the Scherrer radius was determined from the half-peak value of the diffraction peak of the (220) reflection. Also the silicon-based thin films prepared in Example 2 and Comparative Example 2 were subjected to the measurement of Raman scattering spectrum for determining the ratio of Raman intensities between around 520 cm$^{-1}$ (resulting from crystalline component) and around 480 cm$^{-1}$ (resulting from amorphous component). The results obtained are shown in Table 8.

The proportion of the (220) diffraction intensity to the total diffraction intensity, the Scherrer radius and the Raman intensity ratio are indicated by values obtained by normalizing the values of Example 5-1 to 1.

The silicon-based thin films prepared in Examples 5-1, 5-2, 5-3 and 5-4 were excellent in the orientation, crystal grain size and crystallinity, but in particular the silicon-based thin film formed at a pressure of 50 mTorr (6.7 Pa) or more showed a large proportion of the (220) diffraction intensity and good crystallinity, and the crystal grain size was even larger at a pressure of 750 mTorr (700 Pa) or larger.

As explained in the foregoing, the present inventors have found that it is possible to form a silicon-based thin film of excellent crystallinity and crystalline properties and good adhesion to the underlying layer at a high speed by a method which comprises:

introducing a source gas containing silicon halide and hydrogen into the interior of a vacuum vessel, at least a part of the interior being covered with a silicon-containing solid; and generating plasma in the space of the interior of the vacuum vessel, and forming a silicon-based film on a substrate provided in the interior of the vacuum vessel;

wherein the silicon-containing solid is preferably a coating film formed in a region surrounding the plasma generating space in the vacuum vessel, and preferably has a resistivity higher than that of the vacuum vessel;

more preferably, by a method which comprises:

introducing gases containing a silicon-containing gas as a main component into the interior of the vacuum vessel prior to the introduction of the source gas;

generating plasma in the space of the interior of the vacuum vessel; and forming a coating film by plasma CVD;

wherein the silicon-based film preferably contains microcrystals of a crystal grain size having Scherrer radius of 10 nm or more.

Also the present inventors have found that it is possible to form a photovoltaic element having good photoelectric conversion efficiency and excellent adhesion and environmental resistance at a low cost by employing the aforementioned silicon-based thin film in at least a part of at least an i-type semiconductor layer in a photovoltaic element including at least a set of pin junction on a substrate.

Second Embodiment

As a result of intensive investigation for resolving the aforementioned problems, the present inventors have found it is possible to form a silicon-based thin film showing excellent crystallinity and crystalline properties and good adhesion to the underlying layer at a high speed, particularly to form a uniform silicon-based thin film also in case of forming the silicon-based thin film of a large area, by:

introducing a source gas containing silicon halide and hydrogen into the interior of a vacuum vessel, at least a part of the interior being covered with a silicon-containing solid;

generating plasma in the space of the interior of the vacuum vessel; and forming a silicon-based film on a substrate provided in the interior of the vacuum vessel;

wherein preferably the silicon-containing solid is a member having at least a surface composed of silicon; and wherein more preferably the member is at least a member selected from plate-shaped silicon, silicon grain, and a solid having a silicon film coating at least a part of a surface thereof.

Also the present inventors have found that it is possible to form a photovoltaic element having excellent photoelectric conversion efficiency and satisfactory adhesion and environmental resistance with a low cost by employing the aforementioned silicon-based thin film in at least a part of at least an i-type semiconductor layer in a photovoltaic element containing semiconductor layers consisting of at least a set of pin junction on a substrate.

The above-described configuration provides the following effects.

The method of forming a silicon-based thin film containing crystalline phase by plasma CVD utilizing high frequency has a shorter process time and is capable of reducing the process temperature in comparison with the solid phase reaction, thereby being advantageous for cost reduction. Such effect is most evidently exhibited particularly by applying to an i-type semiconductor layer of a large film thickness in a photovoltaic element including a pin junction. More specifically, it is particularly preferable to use a method of film formation by CVD utilizing high frequency of 10 MHz to 10 GHz.

In a photovoltaic element including a pin junction, the use of an i-type semiconductor layer containing crystalline phase as the i-type semiconductor layer substantially functioning as the light absorbing layer provides an advantage of suppressing the photodeteriorating phenomenon caused by Staebler-Wronski effect encountered in case of an amorphous material.

On the other hand, the use of the silicon-based thin film containing crystalline phase as the i-type semiconductor layer is known to deteriorate the performance because the crystal boundaries affect both the majority carriers and the minority carriers. In order to suppress the influence of the crystal boundaries, an increase in the crystal grain size for reducing the density of the crystal boundaries is considered as one of the effective means. It is particularly preferred that the crystal grain size is large in the moving direction of the carriers and that the Scherrer radius is 20 nm or larger when the moving direction of the carriers is defined as a normal plane.

One of the factors increasing the crystal grain size is an increase in the orientatability of the crystal. Film deposition proceeding with random crystal orientation results in mutual collision of the crystal grains in the course of growth thereof, thereby resulting in relatively smaller crystal grains, but an oriented growth in a specified direction is considered to suppress the random mutual collision of the crystal grains, thereby increasing the crystal grain size. Also in crystalline silicon having diamond structure, it is considered possible to form a silicon-based thin film of good adhesion and environmental resistance by adopting a (220) plane as the growth plane, since such (220) plane has the highest atomic density wherein three bonds among four bonds of the silicon atom in the outermost growth plane link with other silicon atoms by covalent bonds. According to the ASTM card, in non-oriented crystalline silicon, the proportion of the (220) plane in the diffraction intensity with respect to the total sum of the diffraction intensities of 11 reflections from the low angle side is about 23%, so that any structure having a proportion of the (220) plane exceeding 23% in the diffraction intensity is oriented in the direction of this plane.

In the high frequency plasma CVD employing a source gas containing silicon halide and hydrogen, various active species are generated in the plasma. The active species in the plasma include atoms, radicals, ions and molecules such as $SiX_nH_m$ ($0 \leq n$, $m \leq 4$), HX, X, H, etc. wherein X represents a halogen atom This system includes active species contributing to etching in addition to those contributing to the deposition of the silicon-based thin film, so that the film deposition proceeds with etching of Si—Si bond having a relatively low bonding strength at the film surface, whereby formation of a silicon-based thin film showing high crystallinity and a low proportion of amorphous regions is rendered possible. Also, since the (220) plane grows with a high bonding strength as explained in the foregoing, it is considered possible, by executing the etching in effective manner, to form a crystalline phase in which the (220) plane selectively constitutes the growing plane. Also since the etching generates radicals by cleavage of chemical bonds to accelerate the structural relaxation, it is considered possible to form a silicon-based thin film of good quality at a lower process temperature, thereby facilitating the cost reduction.

As a result of intensive investigation in view of the suppression of photodeterioration phenomenon resulting from Staebler-Wronski effect and the reduction in the density of the crystal boundaries, the present inventors have found that the Raman scattering intensity resulting from the crystalline component (typically around 520 cm$^{-1}$) is preferably three or more times the Raman scattering intensity resulting from the amorphous phase (typically around 480 cm$^{-1}$) and that the above-mentioned effect is advantageously more enhanced in a structure in which the proportion of the (220) plane in the diffraction intensity is 70% or more of the total diffraction intensities.

The high frequency plasma CVD employing a source gas containing silicon halide and hydrogen involves mutually contradicting reactions of deposition and etching as explained in the foregoing, so that the control of plasma process is an important technical issue in order to achieve high-speed film formation. The addition of hydrogen to silicon halide is considered to form active species of halogenated silane involving hydrogen such as $SiX_2H$, $SiXH_2$ etc., but, in order to form such active species, it is considered to require an active reaction process between $SiX_4$ and hydrogen radical. Also hydrogen radical is considered to accelerate cleavage of excessive X atoms in the deposition film and to diffuse in the vicinity of the growing plane, thereby accelerating the structural relaxation and increasing the crystalline properties. Therefore, in order to realize a crystalline phase of high quality in the high-speed deposition, it is considered important that hydrogen radicals are present in a large amount in the vicinity of the substrate.

The vacuum vessel for film formation is generally composed of a metal such as stainless steel, used in a grounded state, but, by introducing a member having at least a surface composed of silicon in a region of the inside wall of the vacuum vessel, a region having a resistivity higher than that of the vacuum vessel comes into contact with the plasma to relatively increase the ratio of electron deposition in the region, thereby presumably forming a sheath of a relatively larger electric field in the vicinity of the vacuum vessel. Because of the formation of a plasma potential involving the aforementioned sheath, the density of hydrogen ions increases in the vicinity of the vacuum vessel to stimulate the mutual reaction of the active species in the vicinity of the vacuum vessel, thereby increasing the relative density of the hydrogen radicals in the vicinity of the vacuum vessel. For increasing the amount of hydrogen radicals in the vacuum vessel, there can be conceived a method of increasing the amount of hydrogen in the source gas, but the method of introducing the member having at least a surface composed of silicon into the region of the inside wall of the vacuum vessel can locally increase the density of hydrogen plasma, thereby obtaining an effect far superior to that obtained in the method of increasing the amount of hydrogen in the source gas.

By introducing the substrate into the atmosphere having plasma distribution of such a high hydrogen radical density, particularly in case the introduction position of the substrate is in the vicinity of the aforementioned member having at least a surface composed of silicon, it is considered possible to form a silicon-based thin film of crystalline phase of high quality by high-speed deposition. Particularly conspicuous is the effect of increasing the deposition rate.

Also, as explained in the foregoing, the high frequency plasma CVD employing a source gas containing silicon halide and hydrogen involves mutually contradicting reactions of deposition and etching, and is a relatively sensitive reaction system in which the prevailing reaction is determined by various silicon-based thin film forming parameters such as the pressure, silicon halide-hydrogen ratio in the vicinity of the film forming region, distance between the high frequency introducing portion and the substrate, temperature etc. Therefore, particularly in case of forming the silicon-based thin film on a substrate of a large area, there may be formed a region where the etching reaction prevails by the locality of the aforementioned parameters, and there may even be formed a region where the substrate surface is etched without deposition. In case etching occurs instead of deposition on the substrate surface, the atoms contained in the substrate surface are diffused in the atmosphere and fetched in the region of deposition thereby deteriorating the film quality in the region of deposition. By introducing the member having at least a surface composed of silicon into the vacuum vessel, it is rendered possible to cause etching of such member itself in the region where the etching reaction prevails, thereby elevating the Si atom density in the atmosphere in the vicinity of such region, also preventing the etching of the substrate surface and realizing more uniform plasma in comparison with a case of no introduction of the aforementioned member. Consequently it is rendered possible to form a silicon-based thin film with uniform quality over a large area. Also the silicon-based thin film formed in such uniform plasma shows improvements in the adhesion to the underlying layer and in the environmental resistance.

The aforementioned member having at least a surface composed of silicon may be so positioned as to be in contact with the internal wall of the vacuum vessel, or positioned in the plasma space so as to be completely exposed to the plasma.

Figure 12:
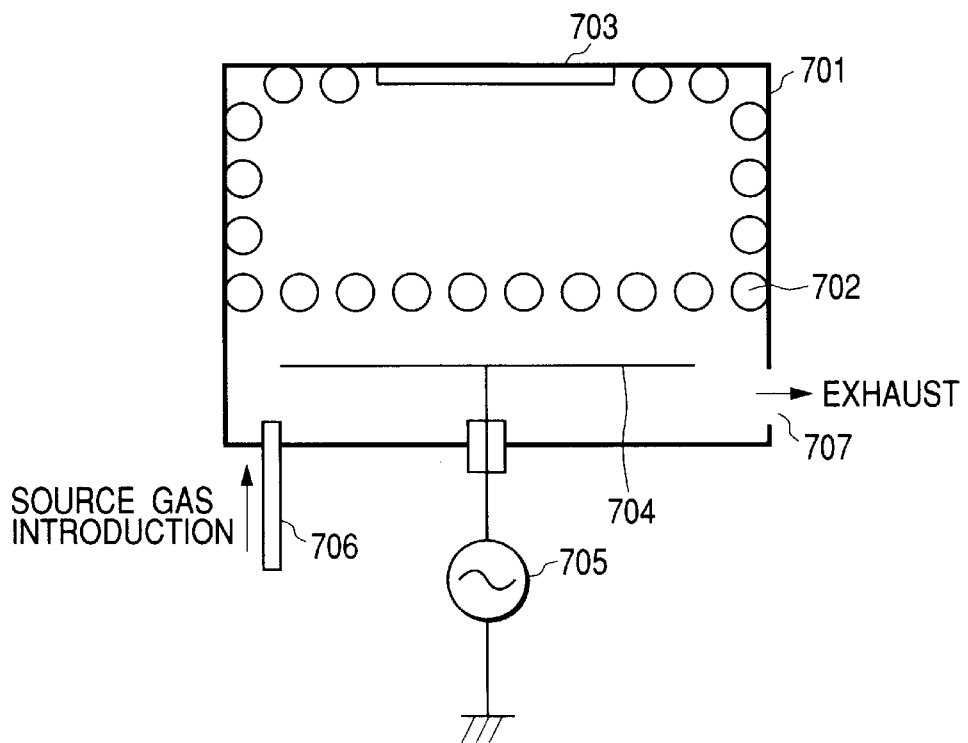
FIG. 12 is a schematic cross-sectional view showing an example of the deposition film forming apparatus having a vacuum vessel in which a member having a surface composed of silicon is arranged.

Preferably, the member having a surface composed of silicon is preferably positioned as shown in FIG. 12. FIG. 12 is a schematic cross-sectional view of an apparatus, in which a rod-shaped member having a surface composed of silicon is positioned in a vacuum vessel. FIG. 12 shows a configuration in which the member having a surface composed of silicon is so positioned as to be in contact with the internal wall of the vacuum vessel, also to be completely exposed to plasma and to be in the vicinity of the substrate.

Figure 13:
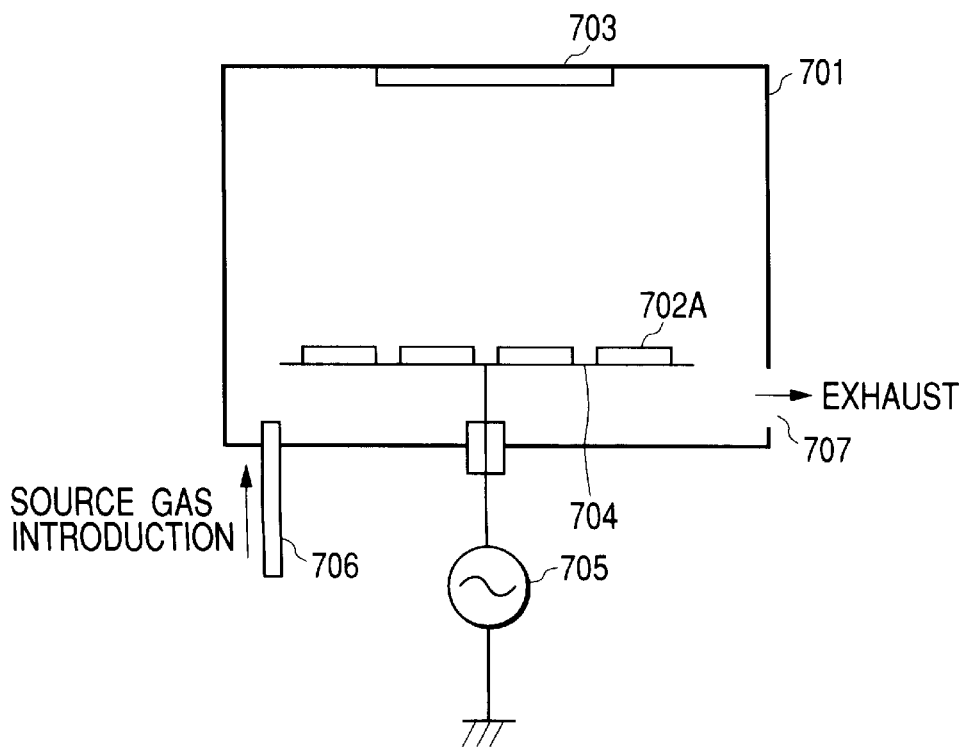
FIG. 13 is a schematic cross-sectional view showing another example of the deposition film forming apparatus having a vacuum vessel in which a member having a surface composed of silicon is arranged.

Particularly, when the substrate and the high frequency introducing portion provided in the vacuum vessel are in a mutually opposed relationship, the member having at least the surface composed of silicon is placed on such high frequency introducing portion as shown in FIG. 13, whereby Si atoms can be efficiently introduced into the atmosphere. Also such positioning of the member having at least the surface composed of silicon on the high frequency introducing portion shifts the self bias thereon to a more negative side, thereby suppressing the unnecessary damage on the substrate by the cations and thus enabling formation of a silicon-based thin film of better crystallinity.

Japanese Patent Publication No. 5-12850 and Japanese Patent Application Laid-Open No. 4-329627 disclose a technology of depositing a semiconductor layer on the internal wall of the reaction oven or on the substrate holder prior to the formation of the semiconductor layer. The purpose of these technologies is to, in a process of forming a semiconductor device including a pin junction or the like within a single reaction oven, particularly in the formation of an i-type layer, to prevent inclusion of the p-type or n-type impurity in the semiconductor formed in a preceding step or in the remaining gas or of the impurities such as oxygen or alkali metal adhering to the internal wall of the reaction oven into the newly formed semiconductor. These technologies are certainly effective for such purpose, but are not effective enough for controlling the balance of the mutually contradicting reaction of deposition and etching intended in the present invention, particularly for forming a silicon-based thin film of a large area with uniform quality. In order to control the balance of the mutually contradicting reactions of deposition and etching and to achieve formation of a silicon-based thin film of a large area with uniform quality, it is important, instead of forming a silicon layer on the internal wall surface, to introduce a separate member having the surface composed of silicon separately from the internal wall.

The aforementioned member having at least the surface composed of silicon can include, as a member having a relatively large surface area, a plate-shaped silicon such as a single-crystalline wafer, a polycrystalline wafer or a silicon plate formed by fusing and solidifying silicon grains; silicon grains as a member having a relatively small surface area; or a metal or dielectric member having a surface covered with a silicon film as a member having arbitrary shape. Also the abovementioned members may be employed in combination. Also such member having at least the surface composed of silicon may be employed not only in a single unit but also in plural units. Also the silicon grains as the aforementioned member may be employed singly or so as to fill the gap of other members. The member is preferably positioned, for example, on the high frequency introducing portion.

The aforementioned silicon film covering the metal or dielectric body can be formed, for example, by high frequency plasma CVD process. The covering formation is preferably executed under a condition with large deposition effect, employing a silicon film forming gas principally composed of a silicon-containing gas such as $SiH_4$, $Si_2H_6$ or $SiF_4$. A diluting gas such as $H_2$ or He may be added to the silicon-containing gas.

Another effect of the formation of the aforementioned film having a surface composed of silicon presumably lies in a catalytic effect for accelerating the deposition reaction. Such effect is not yet clarified in detail, but is presumed to lower the bonding force of unreacted molecules and radicals absorbed in the aforementioned member and to lower the activation energy of the deposition reaction by the chain reaction of such effect.

In the following there will be explained the constituents of a photovoltaic element of the present invention.

Figure 6:
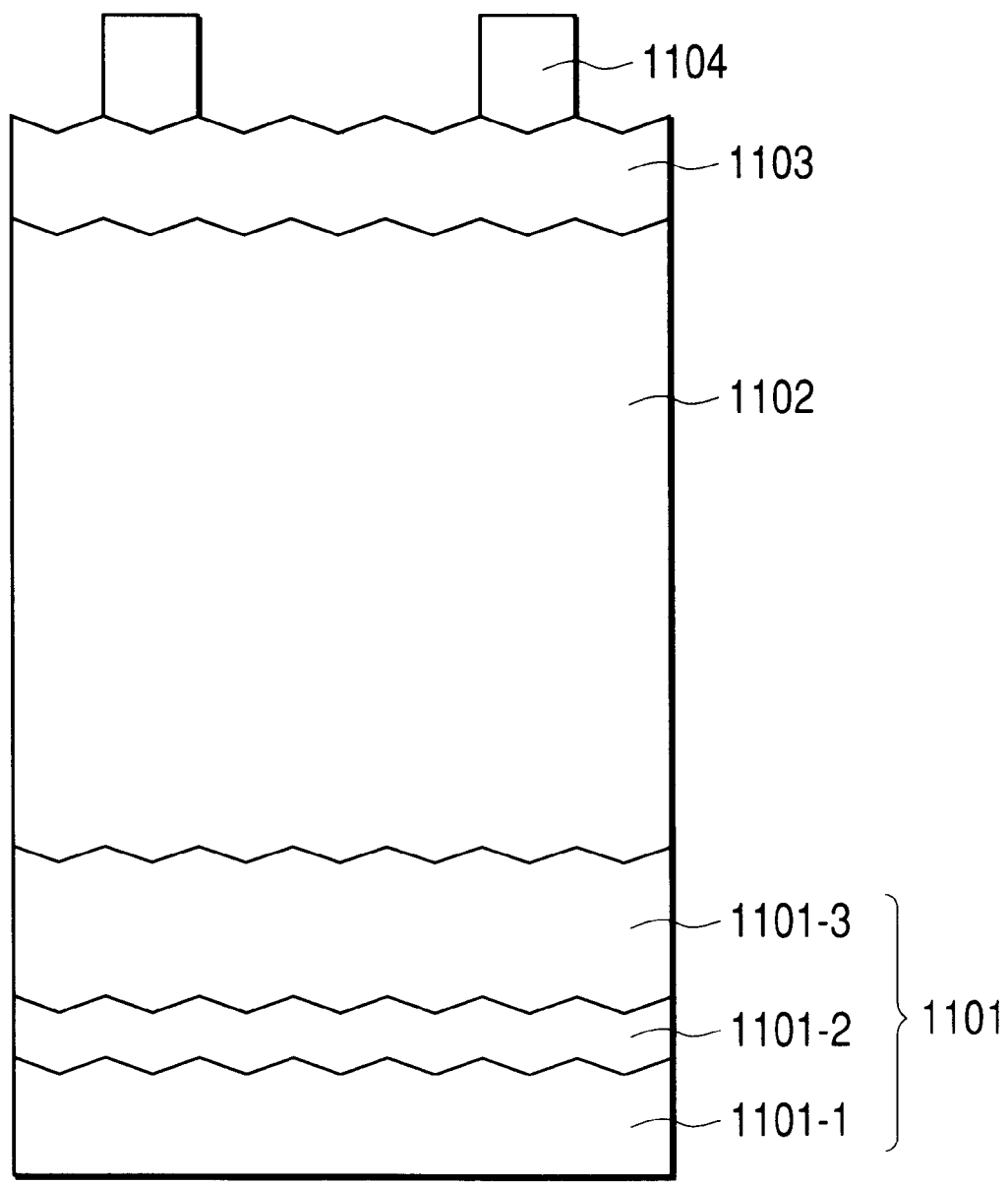
FIG. 6 is a schematic cross-sectional view showing a photovoltaic element of the present invention.

FIG. 6 is a schematic cross-sectional view showing an example of the photovoltaic element of the present invention. FIG. 6 shows a substrate 1101, a semiconductor layer 1102, a second transparent conductive layer 1103, and a current-collecting electrode 1104, wherein a support member 1101-1, a metal layer 1101-2, and a first transparent conductive layer 1101-3 are constituents of the substrate 1101.

Support Member

As the support member 1101-1, there can be preferably employed a plate-shaped or sheet-shaped member composed of a metal, a resinous material, ceramics, a semiconductor bulk, etc. The support member may have a surface with fine irregularities. Also there may be employed a transparent support member to achieve a configuration where the light enters through the support member. Also the support member may be shaped in a long form to enable continuous film formation by the roll-to-roll process. In particular, a flexible material such as stainless steel or polyimide is preferably used as the support member 1101-1.

Metal Layer

The metal layer 1101-2 has a function as an electrode and a function as a reflective layer for reflecting the light reaching the supporting member 1101-1 for re-utilization in the semiconductor layer 1102. It may be preferably composed of Al, Cu, Ag, Au, CuMg or AlSi. It may be preferably formed by evaporation, sputtering, electrodeposition or printing. The metal layer 1101-2 preferably has a surface with irregularities. In this manner, it is rendered possible to extend the optical path length of the reflected light in the semiconductor layer 1102 and to increase the shortcircuit current. In case the supporting member 1101-1 is electroconductive, the metal layer 1101-2 may be omitted.

First Transparent Conductive Layer

The first transparent conductive layer 1101-3 has functions of increasing the random reflection of the incident light and reflected light, and extending the optical path length in the semiconductor layer 1102. It also has a function of preventing that the element of the metal layer 1101-2 diffuses or migrates to the semiconductor layer 1102, thereby causing a shunt in the photovoltaic element. It also has a suitable resistance, thereby preventing shortcircuiting caused by a defect such as a pinhole in the semiconductor layer. Furthermore, the first transparent conductive layer 1101-3 preferably has a surface with irregularities similarly as in the case of the metal layer 1101-2. The first transparent conductive layer 1101-3 is preferably composed of a conductive oxide such as ZnO or ITO, and is preferably formed by evaporation, sputtering, CVD or electrodeposition. A substance for varying the conductivity may be added to such conductive oxide.

The zinc oxide layer is preferably formed by sputtering or electrodeposition.

In case of forming the zinc oxide film by sputtering, the condition is significantly affected by the sputtering method, kind of an employed gas and flow rate thereof, internal pressure, supplied electric power, film forming rate, substrate temperature, etc. For example, in case of forming the zinc oxide film by DC magnetron sputtering employing a zinc oxide target, the gas to be employed can be, for example, Ar, Ne, Kr, Xe, Hg or $O_2$, of which flow rate varies depending on the size of the apparatus and the gas exhausting rate but is preferably within a range of 1 to 100 sccm in case the film forming space has a volume of 20 liters. Also the internal pressure at the film formation is preferably within a range from $1 \times 10^{-4}$ Torr ($133 \times 10^{-4}$ Pa) to 0.1 Torr (13 Pa). The supplied electric power depends on the size of the target, but is preferably within a range from 10 W to 100 kW in case the target has a diameter of 15 cm. Also the preferable range of the substrate temperature varies depending on the film forming rate, but is preferably within a range of 70° C. to 450° C. in case of a film forming rate of 1 μm/hour.

Also in case of forming the zinc oxide film by electrodeposition, there is preferably employing aqueous solution containing nitrate ions and zinc ions in an anticorrosive container. The concentration of the nitrate and zinc ions is preferably within a range of 0.001 to 1.0 mol/liter, more preferably 0.01 to 0.5 mol/liter and most preferably 0.1 to 0.25 mol/liter. The supply source for nitrate and zinc ions is not particularly limited, and may be zinc nitrate constituting the supply source of both ions or a mixture of a water-soluble nitrate salt such as ammonium nitrate constituting the supply source of nitrate ions and a zinc salt such as zinc sulfate constituting the supply source of zinc ions. It is also preferable to add, to such aqueous solution, a hydrocarbon for suppressing the abnormal growth and improving the adhesion. The kind of the hydrocarbon is not particularly limited, but can be a monosaccharide such as glucose or fructose, disaccharide such as maltose or saccharose, a polysaccharide such as dextrin or starch, or a mixture thereof. The amount of hydrocarbon in the aqueous solution is variable depending on the kind of hydrocarbon but is in general preferably within a range of 0.001 to 300 g/liter, more preferably 0.005 to 100 g/liter, and most preferably 0.01 to 60 g/liter. In case of forming the zinc oxide film by electrodeposition, it is preferable to constitute a cathode by the substrate on which the zinc oxide film is to be deposited, and an anode by zinc, platinum or carbon, in the aforementioned aqueous solution. The current density flowing through a load resistor is preferably within a range from 10 $mA/dm^2$ to 10 $A/dm^2$.

Substrate

The substrate 1101 is formed by depositing the metal layer 1101-2 and the first transparent conductive layer 1101-3 according to the necessity on the support member 1101-1 by the above-described methods. Also in order to facilitate the integration of the elements, an insulating layer as an intermediate layer may be provided in the substrate 1101.

Semiconductor Layer

The silicon-based thin film and the semiconductor layer 1102 of the present invention are principally composed of Si of amorphous phase, crystalline phase or a mixed phase. Si may be replaced by an alloy of Si with C or Ge. The semiconductor layer 1102 also contains hydrogen and/or halogen atoms, with a preferred content of 0.1 to 40 atomic %. The semiconductor layer 1102 may also contain oxygen, nitrogen, etc. The semiconductor layer may be rendered p-type or n-type by respectively containing an element of group III or V of the periodic table. As the electric characteristics, such p-type or n-type layer preferably has an activation energy not exceeding 0.2 eV, optimally not exceeding 0.1 eV. Also the specific resistivity is preferably not exceeding 100 Ωcm, optimally not exceeding 1 Ωcm. In case of a stack cell (photovoltaic element with plural pin junctions), it is preferable that the band gap is wider in an i-type semiconductor layer of a pin junction closer to the light entrance side and becomes narrower as the pin junction becomes farther from the light entrance side. Also inside the i-type layer, the minimum value of the band gap is preferably present at the side of the p-type layer with respect to the center of the thickness of the i-type layer. The doped layer (p-type or n-type layer) at the light entrance side is suitably composed of a crystalline semiconductor with low light absorption or a semiconductor with a wide band gap. As an example, a stack cell with two stacked sets of pin junctions, consisting of a combination of i-type silicon-based semiconductor layers, may be composed of, from the light entrance side, (an amorphous semiconductor layer, a semiconductor layer containing crystalline phase) and (a semiconductor layer containing crystalline phase, a semiconductor layer containing crystalline phase). Also as an example of stack cell with three sets of pin junctions, consisting of a combination of i-type silicon-based semiconductor layers, may be composed of, from the light entrance side, (an amorphous semiconductor layer, an amorphous semiconductor layer, a semiconductor layer containing crystalline phase), (an amorphous semiconductor layer, a semiconductor layer containing crystalline phase, a semiconductor layer containing crystalline phase) and (a semiconductor layer containing crystalline phase, a semiconductor layer containing crystalline phase, a semiconductor layer containing crystalline phase). The i-type semiconductor layer preferably has an absorption coefficient α of light (630 nm) of 5000 $cm^1$ or more, a photoconductivity (σp) under light irradiation by a solar simulator (AM 1.5, 100 $mW/cm^2$) of $10 \times 10^{-5}$ S/cm or more, a dark conductivity (σd) $10 \times 10^{-6}$ S/cm or less, and an Urbach energy by the constant photocurrent method (CPM) of 55 meV or less. There may also be employed an i-type semiconductor layer which is slightly p-type or n-type.

Figure 8:
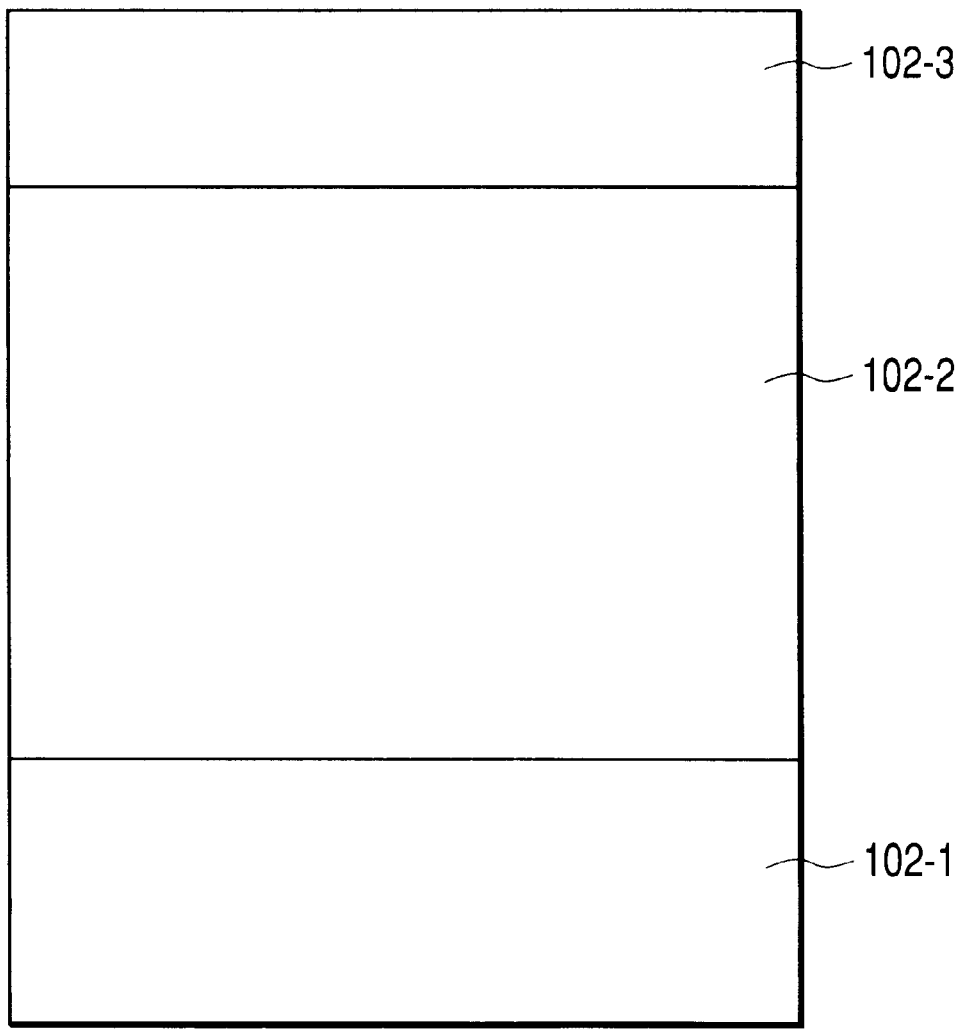
FIG. 8 is a schematic cross-sectional view showing an example of semiconductor layers of the present invention.

In the following there will be given further explanation on the semiconductor layer 1102 which is a constituent of the present invention. FIG. 8 is a schematic cross-sectional view showing a semiconductor layer 1102 having a set of pin junction in an example of the photovoltaic element of the present invention, and consisting of an i-type semiconductor layer 1102-1 having a first conductivity type and containing crystalline phase, an i-type semiconductor layer 1102-2 containing crystalline phase and consisting of a silicon-based thin film of the present invention, and a non-single-crystalline semiconductor layer 102-3 having a second conductivity type which are stacked. In case of a semiconductor layer having a plurality of sets of pin junctions, at least one thereof preferably has the above-described configuration.

Method for Forming Semiconductor Layer

High frequency plasma CVD process is suitable for forming the silicon-based thin film and the semiconductor layer 1102 of the present invention. In the following there will be explained an example of the procedure for forming the semiconductor layer 1102 by the high frequency plasma CVD:

(1) The interior of a semiconductor forming vacuum vessel that can be evacuated is set to a predetermined deposition pressure;

(2) Gasses such as a source gas, a diluting gas, etc. are introduced into the deposition chamber, and the interior thereof is set at the predetermined deposition pressure under evacuation by a vacuum pump;

(3) A substrate 1101 is set at a predetermined temperature by a heater;

(4) High frequency wave oscillated by a high frequency source is introduced into the deposition chamber. The introduction into the deposition chamber may be achieved by guiding the high frequency wave by a wave guide tube and introducing it into the deposition chamber through a dielectric window consisting for example of alumina ceramics, or guiding the high frequency wave by a coaxial cable and introducing it into the deposition chamber through a metal electrode; and (5) Plasma is generated in the deposition chamber to decompose the source gas, thereby forming a deposition film on the substrate 1101 positioned in the deposition chamber. This procedure is repeated plural times to form the semiconductor layer 1102.

For example, preferred forming conditions for the silicon-based thin film and the semiconductor layer 1102 of the present invention include a substrate temperature in the deposition chamber of 100° C. to 450° C., a pressure of 0.5 mTorr (0.067 Pa) to 113 Torr ($1.5 \times 10^4$ Pa), and a high frequency power density of 0.001 to 1 W/cm$^3$ (supplied electric power/deposition chamber volume).

As the source gas for forming the silicon-based thin film and the semiconductor layer 1102 of the present invention, there may be employed a gasifiable compound containing silicon atom such as $SiH_4$ or $Si_2H_6$, or a silicon halide such as $SiF_4$, $Si_2F_6$, $SiH_2F_2$, $SiH_2Cl_2$, $SiCl_4$ or $Si_2Cl_6$. The compound in gaseous phase at room temperature is supplied from a gas container, and the compound in liquid phase is used by bubbling with an inert gas. In case of forming an alloy-based film, it is desirable to add to in the source gas a gasifiable compound containing Ge or C, such as $GeH_2$ or $CH_4$. The source gas is introduced into the deposition chamber preferably under dilution with a diluting gas, which can be $H_2$ or He. Also a gasifiable compound containing nitrogen, oxygen, etc. may be added to the source gas or the diluting gas. For obtaining p-type semiconductor layer, there can be employed a dopant gas such as $B_2H_6$ or $BF_3$. Also for obtaining n-type semiconductor layer, there can be employed a dopant gas such as $PH_3$ or $PF_3$. In case of depositing a thin film of crystalline phase or a layer with low light absorption or with a wide band gap such as SiC, it is preferable to increase the proportion of the diluting gas with respect to the source gas and to introduce the high frequency wave of a relatively high power density.

Also in case of forming the silicon-based thin film of the present invention, a member having at least a surface composed of silicon is introduced into the vacuum vessel. The aforementioned member having at least the surface composed of silicon can be, as a member having a relatively large surface area, a plate-shaped silicon such as a single-crystalline wafer, a polycrystalline wafer or a silicon plate formed by fusing and solidifying silicon grains; or silicon grains as a member having a relatively small surface area; or a metal or dielectric member having a surface covered with a silicon film as a member having an arbitrary shape. Also such members may be employed in combination.

The plate-shaped silicon, such as the silicon plate formed by fusing and solidifying silicon grains, can be formed by a method of charging a die having a groove with silicon grains, maintaining the die for a certain period at a temperature not lower than the melting point of silicon and thereafter solidifying silicon by lowering the temperature. The material of the die is preferably carbon graphite in consideration of ease of working, but there may also be employed silicon carbide, silicon nitride or boron nitride which can be coated with a material capable of releasing the solidified silicon and has a melting point higher than that of silicon. The die is provided with a groove in the horizontal or vertical direction in a plate, and such groove may be provided in plural units in a die. It is also possible to form the groove arranged in the horizontal or vertical direction asymmetrically in the vertical or horizontal direction, respectively, or to provide the die with a radiating plate in order to control the heat flow at the solidification, thereby precipitating the impurities, present in metal silicon, asymmetrically in one side of the plate. Also silicon nitride without reacting with fused silicon and with showing a large contact angle thereto can be preferably used as a releasing agent to be coated on the interior of the die thereby facilitating the releasing of silicon from the die. It is also preferable to add silicon oxide or the like to the releasing agent if necessary. A film of the releasing agent may be formed within the die, for example, by spraying dispersion of powdered silicon nitride in an organic solvent or silanol into the die and heat treating at 400° C. or higher. In order to increase the purity of the surface portion of the plate-shaped silicon, it is effective to include steps of dissolution/re-precipitation. Such dissolution/re-precipitation steps can be achieved by dissolving the surface of plate-shaped silicon into a metal solvent and precipitating silicon in the metal solvent onto the surface of the aforementioned plate-shaped silicon. Since most impurities can be removed in the precipitation, the plate-shaped silicon can have a silicon layer of higher purity, whereby the plate-shaped silicon with a highly pure surface layer. It is particularly preferred that the aforementioned metal solvent is selected from indium, gallium or tin in consideration of the relatively lower melting point and of ability for sufficiently dissolving plate-shaped silicon.

The high frequency plasma CVD process is suitable for forming a silicon film on the surface of a metal or dielectric member, similarly as in the case of the semiconductor layer 1102. Such silicon film preferably has a thickness of 1 µm or larger. The coating-film-forming gas for forming the coating film is preferably composed of a silicon-containing gas such as $SiH_4$, $Si_2H_6$ or $SiF_4$ as a main component, having a large deposition effect, and a diluting gas such as $H_2$ or He. The coating film can be, as explained in the foregoing, of amorphous phase, crystalline phase or mixed phase containing crystalline and amorphous phases.

Second Transparent Conductive Layer

The second transparent conductive layer 1103 constitutes an electrode of the light entrance side and can serve as an antireflective film by suitable adjustment of the film thickness. The second transparent conductive layer 1103 is required to have a high transmittance in a wavelength region absorbable by the semiconductor layer 1102 and a low resistivity. The transmittance at 550 nm is preferably 80% or more, more preferably 85% or more. The resistivity is preferably $5 \times 10^{-3}$ Ωcm or less, more preferably $1 \times 10^{-3}$ Ωcm or less. The second transparent conductive layer 1103 can be preferably composed of ITO, ZnO or $In_2O_3$, and can be preferably formed by evaporation, CVD, spray coating, spin coating or dip coating. A substance for varying the conductivity may be added to the above-mentioned materials.

Current Collecting Electrode

The current-collecting electrode 1104 is provided on the transparent electrode 1103 in order to improve the current-collecting efficiency. It can be preferably formed by a method of forming a metal in the electrode pattern by sputtering with a mask, a method of printing a conductive paste or solder paste, or a method of fixing a metal wire with a conductive paste.

If necessary, protective layers may be formed on both sides of the photovoltaic element. Also a reinforcing member such as a steel plate may be employed on the surfaces (light entrance side and opposite side) of the photovoltaic element.

In the following there will be explained examples of the present invention, taking a solar cell as the example of the photovoltaic element, but such examples by no means limit the content of the present invention.

EXAMPLE 6

Figure 7:
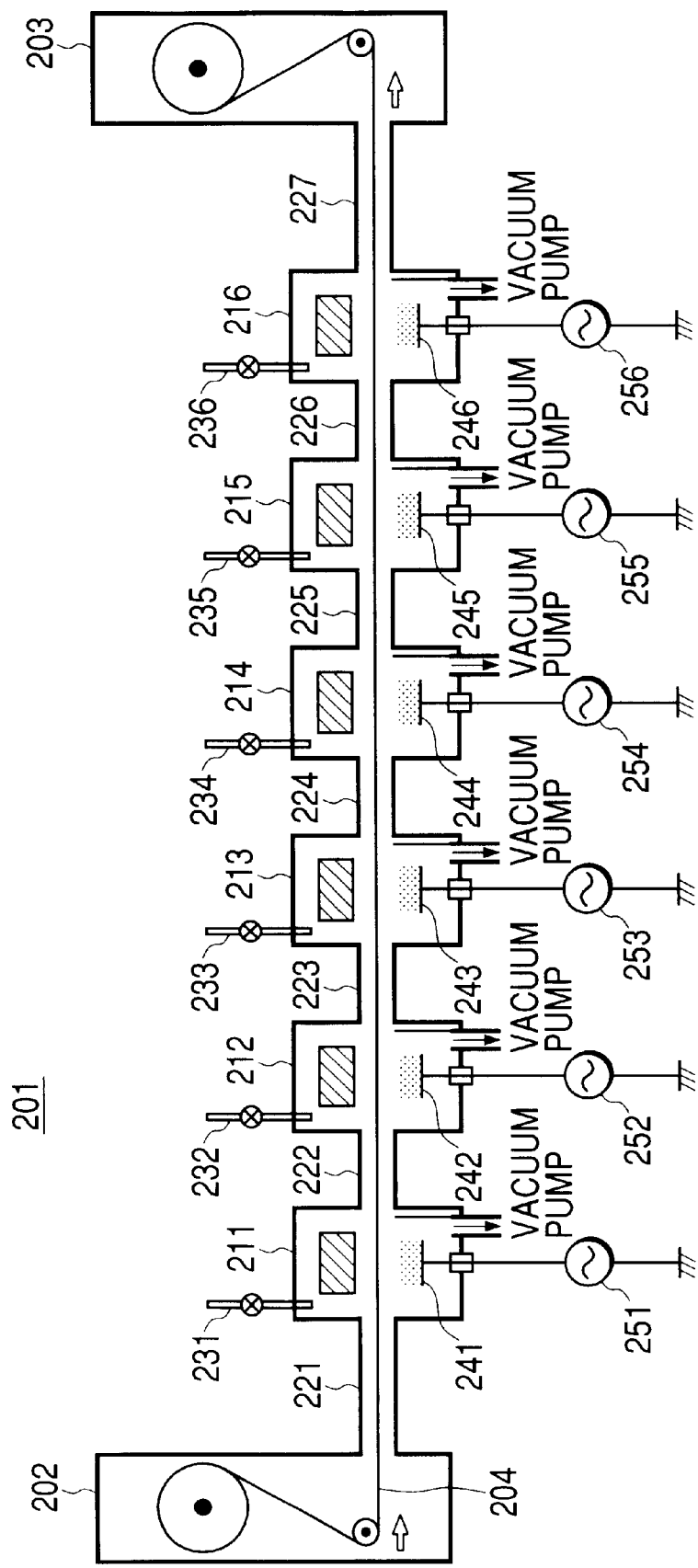
FIG. 7 is a schematic cross-sectional view showing an example of a deposition film forming apparatus employed for producing the silicon-based thin film and the photovoltaic element of the present invention.

The silicon-based thin film was formed by the following procedure with a deposition film forming apparatus 201 shown in FIG. 7.

FIG. 7 is a schematic cross-sectional view showing an example of the deposition film forming apparatus for producing the silicon-based thin film and the photovoltaic element of the present invention. The deposition film forming apparatus 201 shown in FIG. 7 is composed of a substrate feeding container 202, semiconductor forming vacuum vessels 211 to 216, and a substrate wind-up container 203 mutually connected through gas gates 221 to 227. In the deposition film forming apparatus 201, a belt-shaped conductive substrate 204 is set through the vessels and the gas gates. The belt-shaped conductive substrate 204 is fed from a bobbin provided in the substrate feeding container 202, and is wound up on another bobbin in the substrate wind-up container 203.

The semiconductor forming vacuum vessels 211 to 216 are respectively provided with deposition chambers in which high frequency electric powers are applied from high frequency sources 251 to 256 through high frequency introducing portions 241 to 246 to generate glow discharge, thereby decomposing the source gas to deposit semiconductor layers. The semiconductor forming vacuum vessels 211 to 216 are also provided with gas introducing tubes 231 to 236 for introducing source gas and diluting gas, respectively.

The deposition film forming apparatus 201 shown in FIG. 7 is provided with six semiconductor forming vacuum vessels, but, in the following examples, it is not necessary to generate the glow discharge in all the vessels and the presence or absence of the glow discharge can be selected in each vessel according to the layer configuration of the photovoltaic element to be formed. Also each semiconductor forming vacuum vessel is provided with a film forming area adjusting plate (not shown in the drawings) for adjusting the contact area between the conductive substrate 204 and the discharge space in each deposition chamber, and the thickness of the semiconductor film formed in each vessel can be regulated by adjusting the adjusting plate.

At first a belt-shaped substrate (width 40 cm, length 200 m, thickness 0.125 mm) consisting of stainless steel (SUS430BA) was sufficiently degreased and rinsed, then mounted in a continuous sputtering apparatus not shown in the drawings, and was subjected to the sputtering of a thin Ag film of a thickness of 100 nm employing an Ag target. Then a thin ZnO film of a thickness of 1.2 μm was sputtered on the thin Ag film, employing a ZnO target, thereby forming a belt-shaped conductive substrate 204.

Then the conductive substrate 204 wound on a bobbin was mounted in the substrate feeding container 202, then was passed through the gas gate of the entrance side, the semiconductor forming vacuum vessels 211, 212, 213, 214, 215, 216 and the gas gate of the exit side to the substrate wind-up container 203, and was subjected to tension control so that the substrate 204 was not slack. In this state, a non-doped single-crystalline silicon wafer having a (100) oriented surface was placed on the bottom of the deposition chamber of the vacuum vessel 212. Then the substrate feeding container 202, semiconductor forming vacuum vessels 211 to 216 and the substrate wind-up container 203 were sufficiently evacuated to $5 \times 10^{-6}$ Torr ($6.7 \times 10^{-4}$ Pa) or lower by an evacuating system including a vacuum pump not shown in the drawings.

Then, under the operation of the evacuating system, a source gas was supplied to the semiconductor forming vacuum vessel 212 from the gas introducing pipe 232. Also $H_2$ gas at 200 cm$^3$/min (normal) was supplied from the gas introducing pipes to the semiconductor forming vacuum vessels other than the vacuum vessel 212, and $H_2$ gas at 500 cm$^3$/min (normal) was simultaneously supplied as the gate gas to each gas gate from a gate gas supply pipe not shown in the drawings. In this state the evacuating power of the evacuating system was regulated to adjust the pressure in the semiconductor forming vacuum vessel 212 to a desired value. The film forming conditions were as shown in Table 9.

When the internal pressure of the semiconductor forming vacuum vessel 212 was stabilized, the feeding of the conductive substrate 204 was started from the substrate feeding container 202 toward the substrate wind-up container 203.

Then high frequency electric power was introduced from the high frequency source 252 to the high frequency introducing portion 242 of the vacuum vessel 212, and glow discharge was generated in the deposition chamber of the semiconductor forming vacuum vessel 212, thereby forming a silicon-based thin film on the conductive substrate 204 (Example 6). In this operation, high frequency electric power of a frequency of 60 MHz and a power density of 500 mW/cm$^3$ was introduced into the vacuum vessel 212.

Then, glow discharge was generated in the deposition chamber of the semiconductor forming vacuum vessel 212 under the same conditions as in the Example 6, except that the single-crystalline silicon wafer was not mounted on the bottom of the deposition chamber of the semiconductor forming vacuum vessel 212, and this state was held for the same time as in Example 6 (Comparative Example 4).

A silicon-based thin film of a thickness of 1.5 μm was formed on the substrate of Example 6, but no silicon-based thin film was formed on the substrate of Comparative Example 4. The silicon-based thin film formed in Example 6 was subjected to the measurement of the diffraction peak by CuKα line in an X-ray diffraction apparatus to investigate the proportion of the (220) diffraction intensity in the total diffraction intensity. Also the Scherrer radius was determined from the half-peak value of the diffraction peak of the (220) reflection. As a result, the proportion of the (220) diffraction intensity to the total diffraction intensity was 90%, and the Scherrer radius was 45 nm. Also the silicon-based thin film prepared in Example 6 was subjected to the measurement of Raman scattering spectrum for investigating the ratio of the Raman scattering intensity around 520 cm$^{-1}$ (resulting from crystalline component) to the Raman scattering intensity around 480 cm$^{-1}$ (resulting from amorphous component). As a result, the Raman scattering intensity resulting from the crystalline component was 15 times the Raman scattering intensity resulting from the amorphous component.

These results indicate that the conditions of Example 6 enable deposition of the silicon-based thin film that cannot be deposited under the conditions of Comparative Example 4, and the silicon-based thin film formed in the Example 6 is excellent in the orientation of (220) plane, crystal grain size and crystallinity, and that the forming method of the present invention for silicon-based thin film has excellent features.

EXAMPLE 7

The silicon-based thin film was formed by the following procedure with the deposition film forming apparatus 201 shown in FIG. 7.

A belt-shaped conductive substrate 204 was prepared similarly as in Example 6 and mounted in the deposition film forming apparatus 201, and the substrate feeding container 202, the semiconductor forming vacuum vessels 211 to 216 and the substrate wind-up container 203 were sufficiently evacuated to $5 \times 10^{-6}$ Torr ($6.7 \times 10^{-4}$ Pa) or lower by an evacuating system including a vacuum pump not shown in the drawings. In this state, an aluminum rod of a diameter of 20 mm, having an amorphous silicon layer of a thickness of 2 μm deposited by high frequency plasma CVD, was placed on the bottom of the deposition chamber of the semiconductor forming vacuum vessel 212 in such a manner that the longitudinal direction of the rod was perpendicular to the transporting direction of the belt-shaped substrate 204.

The aforementioned aluminum rod having the deposited amorphous silicon thereon was prepared in advance in the semiconductor forming vacuum vessel 215 and was then placed in the vacuum vessel 212. The deposition of the amorphous silicon was conducted by introducing $SiH_4$ at 30 sccm and $H_2$ at 500 sccm into the vacuum vessel 215 through the gas introducing pipe 235, maintaining the pressure in the vacuum vessel 215 at 25 Pa, introducing high frequency electric power of a frequency of 2.45 GHz and a power density of 100 mW/cm² from the high frequency source 255 to the high frequency introducing portion 245 of the vacuum vessel 215, maintaining the aluminum rod at 150° C. and generating glow discharge in the deposition chamber of the semiconductor forming vacuum vessel 215.

Then, under the operation of the evacuating system, a source gas was supplied to the semiconductor forming vacuum vessel 212 from the gas introducing pipe 232. Also $H_2$ gas at 200 cm³/min (normal) was supplied from the gas introducing pipes to the semiconductor forming vacuum vessels other than the vacuum vessel 212, and $H_2$ gas at 500 cm³/min (normal) was simultaneously supplied as the gate gas to each gas gate from a gate gas supply pipe not shown in the drawings. In this state, the evacuating power of the evacuating system was regulated to adjust the pressure in the semiconductor forming vacuum vessel 212 to a desired value. The film forming conditions were as shown in Table 10.

When the internal pressure of the semiconductor forming vacuum vessel 212 was stabilized, the feeding of the conductive substrate 204 was started from the substrate feeding container 202 toward the substrate wind-up container 203.

Then high frequency electric power was introduced from the high frequency source 252 to the high frequency introducing portion 242 of the vacuum vessel 212, and glow discharge was generated in the deposition chamber of the semiconductor forming vacuum vessel 212, thereby forming a silicon-based film on the conductive substrate 204 (Example 7). In this operation, high frequency electric power of a frequency of 100 MHz and a power density of 400 mW/cm³ was introduced into the vacuum vessel 212 through the high frequency introducing portion 242.

Then, glow discharge was generated in the deposition chamber of the semiconductor forming vacuum vessel 212 under the same conditions as in Example 7, except that the aluminum rod of a diameter of 20 mm having the amorphous silicon of a thickness of 2 μm deposited thereon was not mounted on the bottom of the deposition chamber of the semiconductor forming vacuum vessel 212, and this state was held for the same time as in the Example 7 (Comparative Example 5).

A silicon-based thin film of a thickness of 1.5 μm was formed on the substrate of Example 7, but no silicon-based thin film was formed on the substrate of Comparative Example 5. The silicon-based thin film formed in the Example 7 was subjected to the measurement of the diffraction peak by CuKα line in an X-ray diffraction apparatus to investigate the proportion of the (220) diffraction intensity to the total diffraction intensity. Also the Scherrer radius was determined from the half-peak value of the diffraction peak of the (220) reflection. As a result, the proportion of the (220) diffraction intensity in the total diffraction intensity was 85%, and the Scherrer radius was 40 nm. Also the silicon-based thin film prepared in Example 7 was subjected to the measurement of Raman scattering spectrum for investigating the ratio of the Raman scattering intensity around 520 cm⁻¹ (resulting from crystalline component) to the Raman scattering intensity around 480 cm⁻¹ (resulting from amorphous component). As a result, the Raman scattering intensity resulting from the crystalline component was 14 times the Raman scattering intensity resulting from the amorphous component.

These results indicate that the conditions of Example 7 enable deposition of the silicon-based thin film that cannot be deposited under the conditions of Comparative Example 5, and the silicon-based thin film formed in Example 7 is excellent in the orientation of (220) plane, crystal grain size and crystallinity, and that the forming method of the present invention for silicon-based thin film has excellent features.

EXAMPLE 8

The silicon-based thin film was formed by the following procedure with the deposition film forming apparatus 201 shown in FIG. 7.

A belt-shaped conductive substrate 204 was prepared similarly as in Example 6 and mounted in the deposition film forming apparatus 201, and the substrate feeding container 202, the semiconductor forming vacuum vessels 211 to 216 and the substrate wind-up container 203 were sufficiently evacuated to $5 \times 10^{-6}$ Torr ($6.7 \times 10^{-4}$ Pa) or lower by an evacuating system including a vacuum pump not shown in the drawings. In this state, a silicon plate formed by fusing and solidifying silicon grains was placed on the high frequency introducing portion 242 in the deposition chamber of the semiconductor forming vacuum vessel 212.

The aforementioned silicon plate was prepared in the following manner as shown in FIGS. 11A to 11D.

Figure 11A:
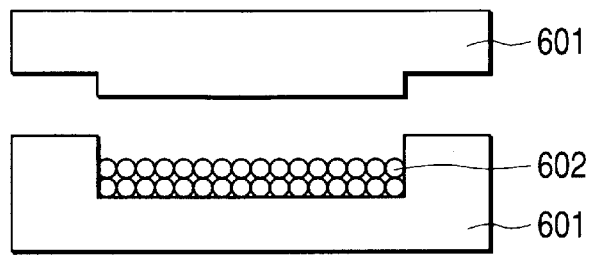
FIGS. 11A, 11B, 11C and 11D are schematic cross-sectional views showing an example of the forming method for a silicon plate.
Figure 11B:
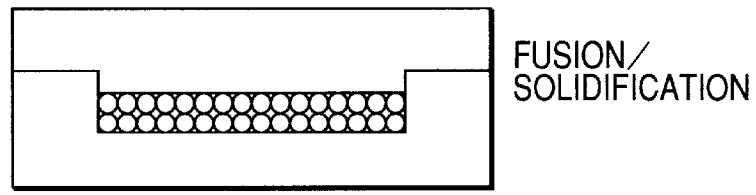
Figure 11C:
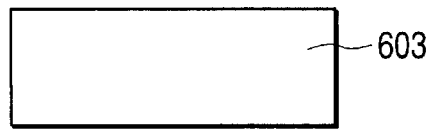

Powdered metal class silicon 602 (purity 98%) was passed through a mixed solution of hydrochloric acid/hydrogen peroxide heated at 120° C. to leach out the impurities, then rinsed, dried and filled in a groove of a carbon graphite die 601 as shown in FIG. 11A. The internal surface of the groove of the die 601 was coated in advance with silanol solution in which powdered $Si_3N_4$ was dispersed and was subjected to heat treatment at 400° C. for forming a releasing film.

The die was placed in an electric oven and was maintained at a constant temperature of 1500° C. which was higher than the melting point of silicon. After 20 minutes in this state, the die was gradually cooled with a temperature decreasing rate of −10° C./min to solidify silicon, thereby forming a sheet-shaped silicon plate 603.

Figure 11D:
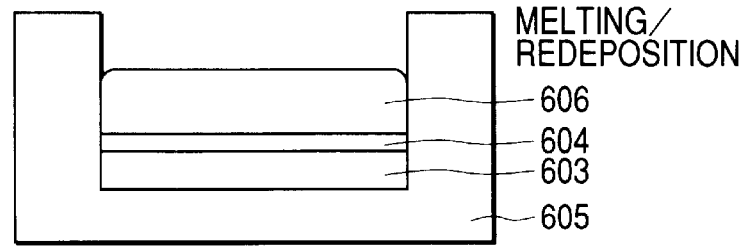

The silicon plate 603 thus prepared was placed in a carbon boat 605 as shown in FIG. 11D. Then metal solvent 606 consisting of tin was placed on and brought into contact with the silicon plate 603 and the system was placed in an electric oven. The interior of the electric oven was maintained at 1050° C. to dissolve the surficial layer of the silicon plate 603 into the tin solvent. When the tin solvent was sufficiently saturated with silicon, the electric oven was so controlled as to reduce the temperature at a rate of −5° C./min thereby re-precipitating silicon in the solvent onto the silicon plate 603 and forming a precipitate layer 604. After precipitation for one hour, the boat was slid to remove the tin solvent. In this manner formed was a non-oriented crystalline silicon plate 603.

Then, under the operation of the evacuating system, a source gas was supplied to the semiconductor forming vacuum vessel 212 from the gas introducing pipe 232. Also $H_2$ gas at 200 cm$^3$/min (normal) was supplied from the gas introducing pipes to the semiconductor forming vacuum vessels other than the vacuum vessel 212, and $H_2$ gas at 500 cm$^3$/min (normal) was at the same time supplied as the gate gas to each gas gate from a gate gas supply pipe not shown in the drawings. In this state, the evacuating power of the evacuating system was regulated to adjust the pressure in the semiconductor forming vacuum vessel 212 to a desired value. The film forming conditions were as shown in Table 11.

When the internal pressure of the semiconductor forming vacuum vessel 212 was stabilized, the feeding of the conductive substrate 204 was started from the substrate feeding container 202 toward the substrate wind-up container 203.

Then high frequency electric power was introduced from the high frequency source 252 to the high frequency introducing portion 242 of the vacuum vessel 212, and glow discharge was generated in the deposition chamber of the semiconductor forming vacuum vessel 212, thereby forming a silicon-based film on the conductive substrate 204 (Example 8). In this operation, high frequency electric power of a frequency of 100 MHz and a power density of 400 mW/cm$^3$ was introduced into the vacuum vessel 212 through the high frequency introducing portion 242.

Then, glow discharge was generated in the deposition chamber of the semiconductor forming vacuum vessel 212 under the same conditions as in Example 8, except that the silicon plate formed by fusing and solidifying silicon grain was not mounted on the bottom of the deposition chamber of the semiconductor forming vacuum vessel 212, and this state was held for the same time as in Example 8 (Comparative Example 6).

A silicon-based thin film of a thickness of 2.0 μm was formed almost over the entire surface of the substrate in Example 8, but a silicon-based thin film of uneven thickness in a range of 0.2 to 1.0 μm was formed on the substrate of Comparative Example 6. The silicon-based thin films formed in Example 8 and Comparative Example 6 were subjected to the measurement of the diffraction peak by CuKα line in an X-ray diffraction apparatus to investigate the proportion of the (220) diffraction intensity to the total diffraction intensity. Also the Scherrer radius was determined from the half-peak value of the diffraction peak of the (220) reflection. Also the silicon-based thin films prepared in Example 8 and Comparative Example 6 were subjected to the measurement of Raman scattering spectrum for investigating the ratio of the Raman scattering intensity between around 520 cm$^{-1}$ (resulting from crystalline component) to the Raman scattering intensity around 480 cm$^{-1}$ (resulting from amorphous component). The obtained results are shown in Table 12.

These results indicate that the conditions of Example 8 enable deposition of the silicon-based thin film at a higher speed and with a more uniform film thickness than deposition under the conditions of Comparative Example 6, and the silicon-based thin film formed in Example 8 is excellent in the orientation, crystal grain size and crystallinity, and that the forming method of the present invention for silicon-based thin film has excellent features.

EXAMPLE 9

Figure 9:
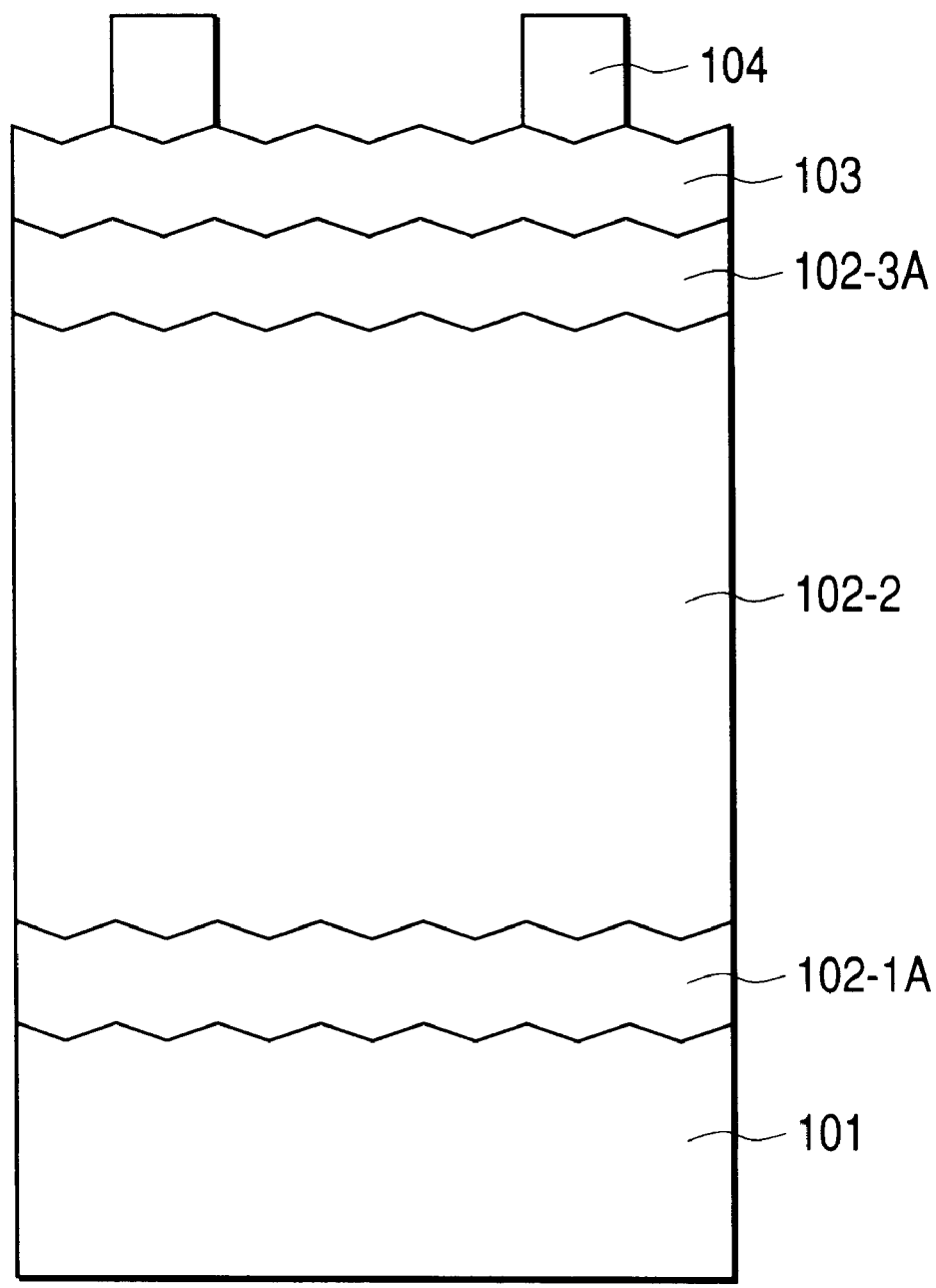
FIGS. 9 and 10 are schematic cross-sectional views showing examples of the photovoltaic element including the silicon-based thin film of the present invention.

A pin-type photovoltaic element shown in FIG. 9 was formed by the following procedure with the deposition film forming apparatus 201 shown in FIG. 7. FIG. 9 is a schematic cross-sectional view showing an example of the photovoltaic element including a silicon-based thin film of the present invention, wherein the same components as those in FIG. 6 are represented by the same numbers and will not be explained further. The semiconductor layer of this photovoltaic element is composed of an amorphous n-type semiconductor layer 1102-1A, an i-type semiconductor layer 1102-2 containing crystalline phase, and a microcrystalline p-type semiconductor layer 1102-3A. Thus, this photovoltaic element is so-called pin type single-cell photovoltaic element.

A belt-shaped conductive substrate 204 was prepared similarly as in Example 6, then mounted on the deposition film forming apparatus 201, and the substrate feeding container 202, semiconductor forming vacuum vessels 211 to 216 and the substrate wind-up container 203 were sufficiently evacuated to 5×10$^{-6}$ Torr (6.7×10$^{-4}$ Pa) or lower by an evacuating system including a vacuum pump not shown in the drawings. In this state, a single-crystalline silicon wafer was placed on the bottom of the deposition chamber of the semiconductor forming vacuum vessel 212.

Then, under the operation of the evacuating system, a source gas and a diluting gas were introduced into the semiconductor forming vacuum vessels 211 to 213 through the gas introducing pipes 231 to 233.

Also $H_2$ gas at 200 sccm was supplied from the gas introducing pipes into the semiconductor forming vacuum vessels other than the vessels 211 to 213, and $H_2$ gas at 500 sccm was simultaneously supplied as the gate gas to each gas gate from a gate gas supply pipe not shown in the drawings. In this state, the evacuating power of the evacuating system was regulated to adjust the pressure in the semiconductor forming vacuum vessels 211 to 213 to a desired value. The forming conditions are shown in Table 13.

When the internal pressures of the semiconductor forming vacuum vessels 211 to 213 were stabilized, the feeding of the conductive substrate 204 was started from the substrate feeding container 202 toward the substrate wind-up container 203.

Then high frequency electric power was introduced from the high frequency sources 251 to 253 to the high frequency introducing portions 241 to 243 of the vacuum vessels 211 to 213, and glow discharges were generated in the deposition chambers of the semiconductor forming vacuum vessels 211 to 213, thereby forming an amorphous n-type semiconductor layer (30 nm thick), an i-type semiconductor layer containing crystalline phase (1.5 μm) and a microcrystalline p-type semiconductor layer (10 nm thick) on the conductive substrate 204, thus completing a photovoltaic element. In this operation, high frequency electric power of a frequency of 13.56 MHz and a power density of 5 mW/cm$^3$ was introduced into the vacuum vessel 211 through the high frequency introducing portion 241, the power of a frequency of 60 MHz and a power density of 500 mW/cm$^3$ was introduced into the vacuum vessel 212 through the high frequency introducing portion 242, and the power of a frequency of 13.56 MHz and a power density of 30 mW/cm$^3$ was introduced into the vacuum vessel 213 through the high frequency introducing portion 243. Then a continuous module forming apparatus not shown in the drawings was employed to form thus formed belt-shaped photovoltaic element into a solar cell module of 36 cm×22 cm (Example 9).

Then, a pin-type single-cell photovoltaic element was prepared in the same manner as in Example 9, except that the single-crystalline silicon wafer was not mounted on the bottom of the deposition chamber of the semiconductor forming vacuum vessel 212, and a solar cell module was formed in the same manner as in Example 9 (Comparative Example 7).

In this operation, since the deposition rate is lower in the formation of the i-type semiconductor layer of Comparative Example 7 than in Example 9, the same film thickness was obtained by increasing the length of the aperture.

The photoelectric conversion efficiency of the solar cell modules prepared in Example 9 and Comparative Example 7 was measured with a solar simulator (AM 1.5, 100 mW/cm$^3$). When the photoelectric conversion efficiency of the solar cell module of Example 9 was normalized at 1, the photoelectric conversion efficiency of Comparative Example 7 was 0.88.

Also the adhesion between the conductive substrate and the semiconductor layer was investigated by a cross cut tape test (gap of 1 mm between cuts, and 100 squares in total). Also the change in the photoelectric conversion efficiency in a cyclic temperature-moisture test was investigated by maintaining a solar cell module, subjected in advance to the measure of the initial photoelectric conversion efficiency, for 30 minutes in a dark place of a temperature of 85° C. and a humidity of 85%, then lowering the temperature to −20° C. over 70 minutes and maintaining this temperature for 30 minutes, then returning to a temperature of 85° C. and a humidity of 85% over 70 minutes and repeating this cycle 100 times, and measuring again the photoelectric conversion efficiency. Also the change in the photoelectric conversion efficiency in a photodeterioration test by subjecting a solar cell module, subjected in advance to the measurement of the initial photoelectric conversion efficiency, to the irradiation for 500 hours by solar simulator light of AM 1.5 and 100 mW/cm$^2$ at 50° C. and by measuring again the photoelectric conversion efficiency. The obtained results are shown in Table 14.

The foregoing results indicate that the solar cell module including the photovoltaic element of the present invention has excellent features.

EXAMPLE 10

Figure 10:
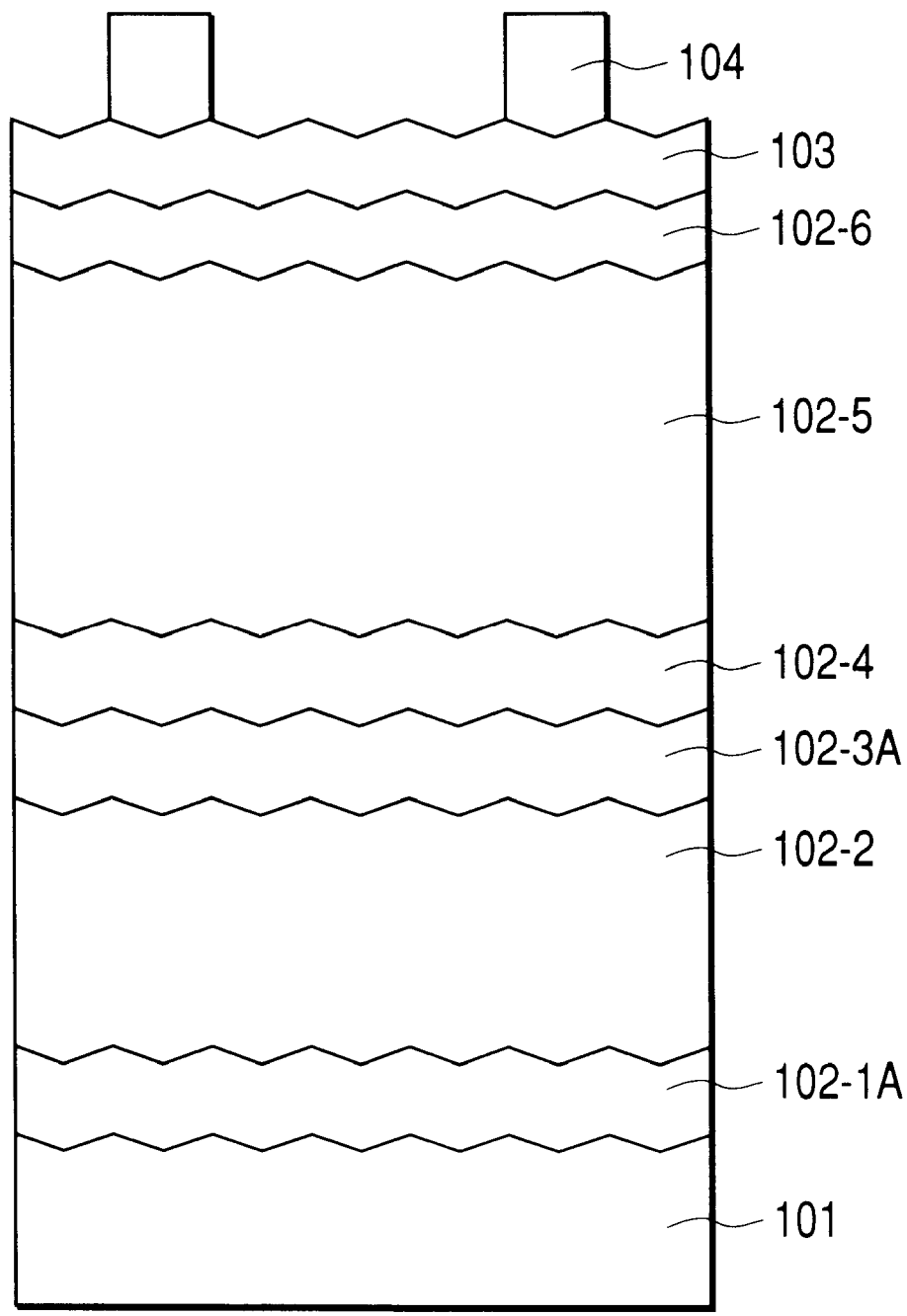

A photovoltaic element shown in FIG. 10 was formed by the following procedure with the deposition film forming apparatus 201 shown in FIG. 7. FIG. 10 is a schematic cross-sectional view showing an example of the photovoltaic element including a silicon-based thin film of the present invention, wherein the same components as those in FIG. 6 are represented by the same numbers and will not be explained further. The semiconductor layer of this photovoltaic element is composed of an amorphous n-type semiconductor layer 1102-1A, an i-type semiconductor layer 1102-2 containing crystalline phase, a microcrystalline p-type semiconductor layer 1102-3A, an amorphous n-type semiconductor layer 1102-4, an amorphous i-type semiconductor layer 1102-5 and a microcrystalline p-type semiconductor layer 1102-6. Thus, this photovoltaic element is so-called pinpin type double-cell photovoltaic element.

A belt-shaped conductive substrate 204 was prepared similarly as in Example 6, then mounted on the deposition film forming apparatus 201, and the substrate feeding container 202, semiconductor forming vacuum vessels 211 to 216 and the substrate wind-up container 203 were sufficiently evacuated to 5×10$^{-6}$ Torr (6.7×10$^{-4}$ Pa) or lower by an evacuating system including a vacuum pump not shown in the drawings.

Then, under the operation of the evacuating system, a source gas and a diluting gas were introduced into the semiconductor forming vacuum vessels 211 to 216 through the gas introducing pipes 231 to 236.

Also H$_2$ gas at 500 sccm was at the same time supplied as the gate gas to each gas gate from a gate gas supply pipe not shown in the drawings. In this state, the evacuating power of the evacuating system was regulated to adjust the pressure in the semiconductor forming vacuum vessels 211 to 216 to a desired value. The forming conditions for the bottom cell and the top cell are shown in Table 15. When the internal pressures of the semiconductor forming vacuum vessels 211 to 216 were stabilized, the feeding of the conductive substrate 204 was started from the substrate feeding container 202 toward the substrate wind-up container 203.

Then high frequency electric power was introduced from the high frequency sources 251 to 256 to the high frequency introducing portions 241 to 246 of the vacuum vessels 211 to 216, and glow discharges were generated in the deposition chambers of the semiconductor forming vacuum vessels 211 to 216, thereby forming an amorphous n-type semiconductor layer (30 nm thick), an i-type semiconductor layer containing crystalline phase (2.0 μm) and a microcrystalline p-type semiconductor layer (10 nm thick) on the conductive substrate 204 to form a bottom cell, then forming an amorphous n-type semiconductor layer (30 nm thick), an amorphous i-type semiconductor layer (0.5 μm thick) and a microcrystalline p-type semiconductor layer (10 nm thick) to form a top cell, thereby completing a double-cell photovoltaic element. In this operation, high frequency electric power of a frequency of 13.56 MHz and a power density of 5 mW/cm$^3$ was introduced into the vacuum vessels 211 and 214 through the high frequency introducing portions 241 and 244, the power of a frequency of 60 MHz and a power density of 500 mW/cm$^3$ was introduced into the vacuum vessel 212 through the high frequency introducing portion 242, the power of a frequency of 13.56 MHz and a power density of 30 mW/cm$^3$ was introduced into the vacuum vessels 213 and 216 through the high frequency introducing portions 243 and 246, and the power of a frequency of 13.56 MHz and a power density of 5 mW/cm$^2$ was introduced into the vacuum vessel 215 through the high frequency introducing portion 245. Then a continuous module forming apparatus not shown in the drawings was employed to form thus formed belt-shaped photovoltaic element into a solar cell module of 36 cm×22 cm (Example 10).

Then after the measurement of the initial photoelectric conversion efficiency, the solar cell module prepared in Example 10 was maintained at 50° C. and continuously irradiated with the solar simulator light of AM 1.5, 100 mW/cm$^3$, while measuring the photoelectric conversion efficiency from time to time. As a result, the photoelectric conversion efficiency of the solar cell module of Example 10 was 1.2 times the photoelectric conversion efficiency of Example 9. Also the solar cell module of Example 10 was excellent in the adhesion and the durability in the temperature-humidity test and in the photodeterioration test, and the foregoing results indicate that the solar cell module including the photovoltaic element of the present invention has excellent features.

As explained in the foregoing, the present inventors have found that it is possible to form a silicon-based thin film of excellent crystallinity and crystalline properties and satisfactory adhesion to the underlying layer at a high speed, particularly to form a uniform silicon-based thin film in case of forming the silicon-based thin film of a large area, by a method which comprises:

introducing a source gas containing silicon halide and hydrogen into the interior of a vacuum vessel, at least a part of the interior being covered with a silicon-containing solid;

generating plasma in the space of the interior of the vacuum vessel, and forming a silicon-based film on a substrate provided in the interior of the vacuum vessel;

wherein the silicon-containing solid is preferably a member having at least a surface composed of silicon;

wherein the member is more preferably selected from a plate-shaped silicon, silicon grains and a solid having a silicon film coating at least a part of a surface thereof.

The present inventors also have found that it is possible to form a photovoltaic element having good photoelectric conversion efficiency and excellent adhesion and environmental resistance at a low cost by employing the aforementioned silicon-based thin film in at least a part of at least an i-type semiconductor layer in a photovoltaic element including at least a set of pin junction on a substrate.

TABLE 1

| Forming condition of vessel 212 | source gas | $SiF_4$: 50 sccm $H_2$: 300 sccm |
|---|---|---|
| | substrate temperature | 400° C. |
| | pressure | 3.0 Torr (400 Pa) |

TABLE 2

| Forming condition of vessel 212 | source gas | $SiF_4$: 50 sccm $SiH_4$: 20 sccm $H_2$: 500 sccm |
|---|---|---|
| | substrate temperature | 400° C. |
| | pressure | 2.0 Torr (270 Pa) |

TABLE 3

| | Example 2 | Comparative Example 2 |
|---|---|---|
| Proportion of (220) diffraction intensity to total diffraction intensity | 1 | 0.7 |
| Scherrer radius of (220) | 1 | 0.65 |
| Raman intensity ratio ($520$ cm$^{-1}$/$480$ cm$^{-1}$) | 1 | 0.55 |

TABLE 4

| Forming condition of vessel 211 | source gas | $SiH_4$: 20 sccm $H_2$: 100 sccm $PH_3$ (diluted to 2% with $H_2$): 30 sccm |
|---|---|---|
| | substrate temperature | 300° C. |
| | pressure | 1.0 mTorr (133 mPa) |
| Forming condition of | source gas | $SiF_4$: 50 sccm $SiH_4$: 20 sccm |

TABLE 4-continued

| vessel 212 | | $H_2$: 300 sccm |
|---|---|---|
| | substrate temperature | 400° C. |
| | pressure | 2.0 Torr (270 Pa) |
| Forming condition of vessel 213 | source gas | $SiH_4$: 10 sccm $H_2$: 800 sccm $BF_3$ (diluted to 2% with $H_2$): 100 sccm |
| | substrate temperature | 200° C. |
| | pressure | 1.2 Torr (160 Pa) |

TABLE 5

| | Example 3 | Comparative Example 3 |
|---|---|---|
| Initial photoelectric conversion efficiency | 1 | 0.85 |
| Number of remaining squares in cross cut tape test | 1 | 0.85 |
| Change in photoelectric conversion efficiency in temperature-humidity test (efficiency after test/initial efficiency) | 1.0 | 0.90 |
| Change in Photoelectric conversion efficiency in photodeterioration test (efficiency after test/initial efficiency) | 1.0 | 0.90 |

Values of initial photoelectric conversion efficiency and number of remaining squares in cross cut tape test are normalized by regarding the values of Example 3 as 1.

TABLE 6

| Forming condition of vessel 211 | source gas | $SiH_4$: 20 sccm $H_2$: 100 sccm $PH_3$ (diluted to 2% with $H_2$): 30 sccm |
|---|---|---|
| | substrate temperature | 300° C. |
| | pressure | 1.0 mTorr (133 mPa) |
| Forming condition of vessel 212 | source gas | $SiF_4$: 50 sccm $SiH_4$: 20 sccm $H_2$: 300 sccm |
| | substrate temperature | 400° C. |
| | pressure | 100 mTorr (13 Pa) |
| Forming condition of vessel 213 | source gas | $SiH_4$: 10 sccm $H_2$: 800 sccm $BF_3$ (diluted to 2% with $H_2$): 100 sccm |
| | substrate temperature | 200° C. |
| | pressure | 1.2 Torr (160 Pa) |
| Forming condition of vessel 214 | source gas | $SiH_4$: 20 sccm $H_2$: 100 sccm $PH_3$ (diluted to 2% with $H_2$): 30 sccm |
| | substrate temperature | 300° C. |
| | pressure | 1.0 Torr (133 Pa) |
| Forming condition of vessel 215 | source gas | $SiH_4$: 20 sccm $H_2$: 100 sccm |
| | substrate temperature | 300° C. |
| | pressure | 1.0 Torr (133 Pa) |
| Forming condition of | source gas | $SiH_4$: 10 sccm $H_2$: 800 sccm |

TABLE 6-continued

| | | |
|---|---|---|
| vessel 216 | | BF$_3$ (diluted to 2% with H$_2$): 100 sccm |
| | substrate temperature | 200° C. |
| | pressure | 1.2 Torr (160 Pa) |

TABLE 7

| | | |
|---|---|---|
| Forming condition of vessel 212 | source gas | SiF$_4$: 50 sccm<br>H$_2$: 200 sccm |
| | substrate temperature | 350° C. |
| | pressure | 30 mTorr (4 Pa) (Example 5-1)<br>50 mTorr (6.7 Pa) (Example 5-2)<br>750 mTorr (100 Pa) (Example 5-3)<br>2.0 Torr (270 Pa) (Example 5-4) |

TABLE 8

| | Example 5-1 | Example 5-2 | Example 5-3 | Example 5-4 |
|---|---|---|---|---|
| Pressure | 30 mTorr (4 Pa) | 50 mTorr (6.7 Pa) | 750 mTorr (100 Pa) | 2.0 Torr (270 Pa) |
| Proportion of (220) Diffraction intensity to total diffraction intensity | 1 | 1.20 | 1.30 | 1.35 |
| Scherrer radius of (220) | 1 | 1.05 | 1.30 | 1.40 |
| Raman intensity ratio (520 cm$^{-1}$/480 cm$^{-1}$) | 1 | 1.20 | 1.25 | 1.25 |

Proportion of (220) diffraction intensity to total diffraction intensity, Scherrer radius of (220) and Raman intensity ratio are normalized by regarding the values of Example 5-1 as 1.

TABLE 9

| | | |
|---|---|---|
| Forming condition of vessel 212 | source gas | SiF$_4$: 150 cm$^3$/min (normal)<br>H$_2$: 300 cm$^3$/min (normal) |
| | substrate temperature | 400° C. |
| | pressure | 200 Pa (1.5 Torr) |

TABLE 10

| | | |
|---|---|---|
| Forming condition of vessel 212 | source gas | SiF$_4$: 200 cm$^3$/min (normal)<br>H$_2$: 500 cm$^3$/min (normal) |
| | substrate temperature | 400° C. |
| | pressure | 150 Pa (1.12 Torr) |

TABLE 11

| | | |
|---|---|---|
| Forming condition of vessel 212 | source gas | SiF$_4$: 200 cm$^3$/min (normal)<br>SiH$_4$: 40 cm$^3$/min (normal)<br>H$_2$: 400 cm$^3$/min (normal) |
| | substrate temperature | 400° C. |
| | pressure | 200 Pa (1.5 Torr) |

TABLE 12

| | Example 8 | Comparative Example 6 |
|---|---|---|
| Proportion of (220) diffraction intensity to total diffraction intensity | 1 | 0.70 |
| Scherrer radius of (220) | 1 | 0.60 |
| Raman intensity ratio (520 cm$^{-1}$/480 cm$^{-1}$) | 1 | 0.60 |

Proportion of (220) diffraction intensity to total diffraction intensity, Scherrer radius of (220) and Raman intensity ratio are normalized by regarding the values of Example 8 as 1.

TABLE 13

| | | |
|---|---|---|
| Forming condition of vessel 211 | source gas | SiH$_4$: 20 sccm<br>H$_2$: 100 sccm<br>PH$_3$ (diluted to 2% with H$_2$): 30 sccm |
| | substrate temperature | 300° C. |
| | pressure | 133 Pa (1.0 Torr) |
| Forming condition of vessel 212 | source gas | SiF$_4$: 200 cm$^3$/min (normal)<br>SiH$_4$: 30 cm$^3$/min (normal)<br>H$_2$: 500 cm$^3$/min (normal) |
| | substrate temperature | 400° C. |
| | pressure | 200 Pa (1.5 Torr) |
| Forming condition of vessel 213 | source gas | SiH$_4$: 10 sccm<br>H$_2$: 800 sccm<br>BF$_3$ (diluted to 2% with H$_2$): 100 sccm |
| | substrate temperature | 200° C. |
| | pressure | 160 Pa (1.2 Torr) |

TABLE 14

| | Example 9 | Comparative Example 7 |
|---|---|---|
| Initial photoelectric conversion efficiency | 1 | 0.88 |
| Number of remaining squares in cross cut tape test | 1 | 0.83 |
| Change in Photoelectric conversion efficiency in temperature-humidity test (efficiency after test/initial efficiency) | 1.0 | 0.87 |
| Change in Photoelectric conversion efficiency in photodeterioration test (efficiency after test/initial efficiency) | 1.0 | 0.90 |

Values of initial photoelectric conversion efficiency and remaining squares in cross cut tape test are normalized by regarding the values of Example 9 as 1.

TABLE 15

| | | |
|---|---|---|
| Forming condition of vessel 211 | source gas | SiH$_4$: 20 sccm<br>H$_2$: 100 sccm<br>PH$_3$ (diluted to 2% with H$_2$): 30 sccm |
| | substrate temperature | 300° C. |
| | pressure | 133 Pa (1.0 Torr) |

TABLE 15-continued

| Forming condition of vessel 212 | source gas | SiF$_4$: 200 cm$^3$/min (normal)<br>SiH$_4$: 30 cm$^3$/min (normal)<br>H$_2$: 500 cm$^3$/min (normal) |
| --- | --- | --- |
| | substrate temperature | 400° C. |
| | pressure | 200 Pa (1.5 Torr) |
| Forming condition of vessel 213 | source gas | SiH$_4$: 10 sccm<br>H$_2$: 800 sccm<br>BF$_3$ (diluted to 2% with H$_2$): 100 sccm |
| | substrate temperature | 200° C. |
| | pressure | 160 Pa (1.2 Torr) |
| Forming condition of vessel 214 | source gas | SiH$_4$: 20 sccm<br>H$_2$: 100 sccm<br>BF$_3$ (diluted to 2% with H$_2$): 30 sccm |
| | substrate temperature | 300° C. |
| | pressure | 133 Pa (1.0 Torr) |
| Forming condition of vessel 215 | source gas | SiH$_4$: 20 sccm<br>H$_2$: 100 sccm |
| | substrate temperature | 300° C. |
| | pressure | 133 Pa (1.0 Torr) |
| Forming condition of vessel 216 | source gas | SiH$_4$: 10 sccm<br>H$_2$: 800 sccm<br>BF$_3$ (diluted to 2% with H$_2$): 100 sccm |
| | substrate temperature | 200° C. |
| | pressure | 160 Pa (1.2 Torr) |

What is claimed is:

1. A method of forming a silicon-based film by plasma CVD, which comprises:
   introducing a source gas containing silicon halide and hydrogen to an interior of a vacuum vessel, at least a part of the interior being covered with a silicon-containing solid;
   generating plasma in a space of the interior of the vacuum vessel; and
   forming a silicon-based film on a substrate provided in the interior of the vacuum vessel,
   wherein the silicon-containing solid is a coating film formed in a region surrounding a plasma generating space in the vacuum vessel and having a resistivity higher than that of the vacuum vessel.

2. A method according to claim 1, wherein the coating film is formed by:
   introducing gases containing a silicon-containing gas as a main component into the interior of the vacuum vessel prior to the introduction of the source gas;
   generating plasma in the space of the vacuum vessel; and
   forming the coating film by plasma CVD.

3. A method according to claim 1, wherein the silicon-based film includes microcrystals of a crystal grain size having a Scherrer radius of 10 nm or more.

4. A method according to claim 1, wherein a film forming rate of the silicon-based film after formation of the coating film having a resistivity higher than that of the vacuum vessel is three or more times a film forming rate of the silicon-based film in case of no formation of the coating film.

5. A method according to claim 4, wherein the film forming rate of the silicon-based film after formation of the coating film having a resistivity higher than that of the vacuum vessel is 1.0 nm/sec or higher.

6. A method according to claim 1, wherein the resistivity of the coating film is higher than that of the silicon-based film.

7. A method according to claim 1, wherein the coating film having the resistivity higher than that of the vacuum vessel is composed of silicon.

8. A method according to claim 2, wherein the gases containing the silicon-containing gas as a main component do not contain silicon halide gas.

9. A method according to claim 1, wherein the silicon halide contains at least one of fluoride and chloride.

10. A method according to claim 1, wherein a Raman scattering intensity resulting from a crystalline component of the silicon-based film is three or more times a Raman scattering intensity resulting from an amorphous component thereof.

11. A method according to claim 1, wherein a proportion of (220) diffraction intensity of the silicon-based film by X-ray or electron beam diffraction is 50% or more of a total diffraction intensity thereof.

12. A method according to claim 1, wherein a pressure within the vacuum vessel in formation of the silicon-based film is 50 mTorr or more.

13. A method according to claim 1, wherein the silicon-containing solid is a member having at least a surface composed of silicon.

14. A method according to claim 13, wherein the member is at least one selected from a plate-shaped silicon, silicon grains, and a solid having a silicon film coating at least a part of a surface thereof.

15. A method according to claim 13, wherein the substrate and a high frequency introducing portion provided in the vacuum vessel are in a mutually opposed relationship.

16. A method according to claim 15, wherein the member is placed on the high frequency introducing portion.

17. A method according to claim 13, wherein the silicon halide contains at least one of fluoride and chloride.

18. A method according to claim 13, wherein the silicon-based film includes microcrystals of a crystal grain size having a Scherrer radius of 20 nm or more.

19. A method according to claim 13, wherein a Raman scattering intensity resulting from a crystalline component of the silicon-based film is three or more times a Raman scattering intensity resulting from an amorphous component thereof.

20. A method according to claim 13, wherein a proportion of (220) diffraction intensity of the silicon-based film by X-ray or electron beam diffraction is 70% or more of the total diffraction intensity.

* * * * *